(12) United States Patent
Takahashi et al.

(10) Patent No.: US 10,262,876 B2
(45) Date of Patent: Apr. 16, 2019

(54) SUBSTRATE PROCESSING APPARATUS

(71) Applicant: SCREEN Holdings Co., Ltd., Kyoto (JP)

(72) Inventors: Hiroaki Takahashi, Kyoto (JP); Yuto Kubo, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 170 days.

(21) Appl. No.: 15/019,212

(22) Filed: Feb. 9, 2016

(65) Prior Publication Data

US 2016/0240400 A1   Aug. 18, 2016

(30) Foreign Application Priority Data

Feb. 16, 2015 (JP) .................................. 2015-27959
Feb. 16, 2015 (JP) .................................. 2015-27960

(51) Int. Cl.
*H01L 21/67* (2006.01)
*B08B 3/02* (2006.01)

(52) U.S. Cl.
CPC .......... *H01L 21/67017* (2013.01); *B08B 3/02* (2013.01); *H01L 21/6708* (2013.01); *H01L 21/67051* (2013.01)

(58) Field of Classification Search
CPC ............................................... H01L 21/67017
See application file for complete search history.

(56) References Cited

U.S. PATENT DOCUMENTS

| 2003/0089799 A1 | 5/2003 | Kanno .......................... 239/434 |
| 2005/0156285 A1 | 7/2005 | Gates et al. .................. 257/632 |
| 2006/0147202 A1 | 7/2006 | Yasuda et al. ................ 396/611 |
| 2009/0170334 A1 | 7/2009 | Fang et al. .................... 438/710 |
| 2010/0136492 A1 | 6/2010 | Yasuda et al. ................ 430/325 |
| 2010/0247761 A1* | 9/2010 | Hashimoto ....... H01L 21/67051 427/240 |
| 2010/0310772 A1 | 12/2010 | Tsuda ....................... 427/255.28 |
| 2012/0073609 A1 | 3/2012 | Hashimoto et al. ........... 134/26 |
| 2013/0255728 A1 | 10/2013 | Noh .............................. 134/26 |
| 2014/0166055 A1 | 6/2014 | Huang et al. .................. 134/33 |
| 2014/0206202 A1 | 7/2014 | Kimura et al. .............. 438/761 |

FOREIGN PATENT DOCUMENTS

| CN | 101772833 A | 7/2010 |
| CN | 101986777 A | 3/2011 |
| CN | 103357607 A | 10/2013 |
| JP | 08-052443 A | 2/1996 |
| JP | 08-078368 | 3/1996 |

(Continued)

*Primary Examiner* — Jason Y Ko
(74) *Attorney, Agent, or Firm* — Ostrolenk Faber LLP

(57) ABSTRACT

A substrate holding unit which holds the substrate, a nozzle which includes a first cylindrical member within which a first flow path along which the first fluid is passed is formed and in which a tip end edge of the first cylindrical member defines, between the tip end edge and a main surface of the substrate, an annular first discharge port that discharges the fluid flowing through the first flow path along the main surface of the substrate radially and a first fluid supply unit which is a fluid supply unit supplying the first fluid to the first flow path of the nozzle and which applies, to the nozzle, a force in a direction apart from the main surface of the substrate, by the discharge of the first fluid from the first discharge port.

23 Claims, 13 Drawing Sheets

(56) References Cited

FOREIGN PATENT DOCUMENTS

| | | |
|---|---|---|
| JP | 2001-087725 A | 4/2001 |
| JP | 2003-145062 A | 5/2003 |
| JP | 2008-108830 A | 5/2008 |
| JP | 2009-277981 A | 11/2009 |
| JP | 2011-071438 A | 4/2011 |
| JP | 2012-074589 A | 4/2012 |
| JP | 2014-022495 A | 2/2014 |
| JP | 2014-138153 A | 7/2014 |
| KR | 10-2006-0063684 A | 6/2006 |
| TW | M310438 U | 4/2007 |
| TW | 200945436 A1 | 11/2009 |
| TW | 200952109 A1 | 12/2009 |
| TW | I324381 | 5/2010 |
| WO | WO 2009/085238 A1 | 7/2009 |

* cited by examiner

SUBSTRATE PROCESSING APPARATUS

BACKGROUND OF THE INVENTION

1. Field of the Invention

The present invention relates to a substrate processing apparatus that uses a processing fluid to process a substrate. The substrate to be processed includes, for example, a semiconductor wafer, a substrate for a liquid crystal display, a substrate for a plasma display, a substrate for an FED (Field Emission Display), a substrate for a magnetic disk, a substrate for an optical disk, a substrate for a magneto-optical disk, a substrate for a photomask, a ceramic substrate, and a substrate for a solar cell.

2. Description of Related Art

In the manufacturing process of a semiconductor device and a liquid crystal display device, it is a matter of necessity to perform cleaning processing for removing foreign substances such as particles from the front surface of a substrate such as a semiconductor wafer or a liquid crystal display panel glass substrate.

For example, a single substrate processing type substrate processing apparatus that processes substrates one by one includes a spin chuck that rotates the substrate while holding, with a plurality of chuck pins, the substrate substantially horizontally and a nozzle for supplying a processing liquid to the front surface of the substrate rotated by the spin chuck (Japanese Patent Application Publication No. 8-78368).

In the processing of the substrate, the substrate is rotated by the spin chuck. A cleaning chemical liquid is supplied from the nozzle to the front surface of the substrate being rotated. The cleaning chemical liquid supplied on the front surface of the substrate receives a centrifugal force produced by the rotation of the substrate and flows on the front surface of the substrate toward the circumferential edge. In this way, the cleaning chemical liquid is spread over the entire region of the front surface of the surface, and cleaning processing is performed on the front surface of the substrate. After the supply of the cleaning chemical liquid, rinse processing for cleaning, with a rinse liquid, the cleaning chemical liquid adhered to the substrate is performed. Specifically, the rinse liquid is supplied from the nozzle to the front surface of the substrate rotated by the spin chuck, the rinse liquid thereof receives the centrifugal force produced by the rotation of the substrate so as to be extended and the cleaning chemical liquid adhered to the front surface of the substrate is washed out.

SUMMARY OF THE INVENTION

The inventors of the present application have found that a removal moment for removing, from the front surface of the substrate, particles adhered to the front surface depends on a lateral flow speed of a first fluid (the cleaning chemical liquid and the rinse liquid) in the vicinity of the front surface (main surface) of the substrate W.

Hence, an object of the present invention is to provide a substrate processing apparatus that can increase the flow speed of the first fluid on the main surface of the substrate and that can satisfactorily remove foreign substances such as particles adhered to the main surface of the substrate.

According to a first aspect of this invention, there is provided a substrate processing apparatus that performs, on a substrate, processing using a processing fluid containing a first fluid, the substrate processing apparatus including a substrate holding unit which holds the substrate, a nozzle which includes a first cylindrical member within which a first flow path along which the first fluid is passed is formed and in which a tip end edge of the first cylindrical member defines, between the tip end edge and a main surface, an annular first discharge port that discharges the fluid flowing through the first flow path along the main surface of the substrate radially, a support member which supports the nozzle, a nozzle holding unit in which the nozzle is held by the support member in a state where a relative displacement along a normal to the main surface of the substrate can be performed, and a first fluid supply unit supplying the first fluid to the first flow path of the nozzle and which applies, to the nozzle, a force in a direction apart from the main surface of the substrate, by the discharge of the first fluid from the first discharge port.

According to this configuration, the first fluid is discharged from the annular first discharge port formed between the main surface of the substrate and the tip end edge (the tip end edge of the first cylindrical member) of the nozzle along the main surface of the substrate radially. By the discharge of the first fluid from the first discharge port, the force (separation direction force) apart from the main surface of the substrate is applied to the nozzle. The nozzle is held by the support member such that a relative displacement along the normal to the main surface of the substrate can be performed. Hence, the nozzle receives the separation direction force produced by the discharge of the first fluid from the first discharge port, and is relatively displaced in the direction apart from the main surface of the substrate with respect to the support member. The separation direction force produced by the discharge of the first fluid from the first discharge port and applied to the nozzle is increased as the space between the main surface of the substrate and the tip end edge of the nozzle is narrowed. Hence, when a force (approach direction force) in the direction approaching the main surface of the substrate is applied to the nozzle, the nozzle is held in such a position that the approach direction force is in balance with the separation direction force produced by the discharge of the first fluid from the first discharge port.

Hence, the flow rate of the first fluid discharged from the first discharge port is set appropriate, and thus it is possible to provide a gap having an extremely small space between the tip end edge of the nozzle and the main surface of the substrate. In other words, it is possible to provide the opening width of the annular first discharge port in a direction along the normal such that the opening width is extremely small. Thus, it is possible to increase the flow speed of the first fluid discharged from the first discharge port. In this way, it is possible to increase the flow speed of the first fluid on the main surface of the substrate, with the result that it is possible to satisfactorily remove foreign substances such as particles adhered to the main surface of the substrate.

In a preferred embodiment of this invention, the nozzle holding unit includes a load application unit that applies, to the nozzle, a load in a direction along the normal and a load adjustment unit that adjusts the magnitude of the load applied from the load application unit to the nozzle.

According to this configuration, the load adjustment unit adjusts the magnitude of the load in the direction along the normal direction to the main surface of the substrate, and thus it is possible to adjust the opening width in the direction along the normal to the main surface of the substrate. Hence, not only the flow rate of the first fluid discharged from the first discharge port but also the load in the direction along the normal direction applied to the nozzle is adjusted, and thus it is possible to set the opening width in the normal direction at an extremely small width. Thus, it is not necessary to adjust the flow rate of the first fluid discharged from the nozzle in order to adjust the opening width in the normal direction. Therefore, it is possible to reduce the flow rate of the first fluid discharged from the nozzle to a small amount, and in this case, it is possible to reduce the first fluid.

The load application unit may include a first load application unit that applies, to the nozzle, a load in a direction approaching the main surface of the substrate and a second load application unit that applies, to the nozzle, a load in a direction apart from the main surface of the substrate. In this case, a load adjustment unit adjusts the load in the direction approaching the main surface of the substrate applied by the first load application unit to the nozzle.

According to this configuration, the load in a direction opposite to the first load application unit and the second load application unit is applied to the nozzle. Then, the load adjustment unit adjusts the load in the direction approaching the main surface of the substrate. Thus, it is possible to accurately adjust the opening width of the first discharge port in the direction along the normal to the main surface of the substrate.

When the load in the direction approaching the main surface of the substrate is cancelled by the load adjustment unit, the nozzle receives the load applied from the second load application unit to the substrate, and is moved in the direction apart from the main surface of the substrate. In this way, without provision of another lifting/lowering unit, the nozzle can be satisfactorily lifted from a region in the vicinity of the main surface of the substrate.

The first load application unit includes, for example, a cylinder. The second load application unit is suspended from, for example, the support member, and includes an elastic member interposed between the nozzle and the support member.

A tip end portion of the first cylindrical member may include an enlarged diameter inner wall whose diameter is enlarged so as to separate from the normal as the tip end portion approaches the main surface of the substrate.

According to this configuration, the tip end portion of the first cylindrical member includes the enlarged diameter inner wall whose diameter is enlarged so as to separate from the normal as the tip end portion approaches the main surface of the substrate. Hence, in the process in which the first fluid flows through the first flow path toward the first discharge port, a flow in the direction along the main surface of the substrate is formed. In this way, it is possible to further increase the flow speed of the first fluid discharged from the annular first discharge port in the direction along the main surface of the substrate, with the result that it is possible to satisfactorily remove foreign substances such as particles adhered to the main surface of the substrate.

The tip end edge of the first cylindrical member may include a flat surface portion that is extended along the main surface of the substrate.

According to this configuration, the flat surface portion provided at the tip end edge of the first cylindrical member is extended along the main surface of the substrate. The flat surface portion guides the first fluid discharged from the first discharge port in the direction along the main surface of the substrate. Thus, it is possible to further increase the flow speed of the first fluid discharged from the first discharge port in the direction along the main surface of the substrate, with the result that it is possible to satisfactorily remove foreign substances such as particles adhered to the main surface of the substrate.

The first fluid passed along the first flow path may be a liquid. According to this configuration, the liquid is discharged radially along the main surface of the substrate from the annular first discharge port formed between the main surface of the substrate and the tip end edge (tip end edge of the first cylindrical member) of the nozzle. The flow rate of the liquid discharged from the first discharge port is set appropriate, and thus it is possible to provide a gap having an, extremely small space between the tip end edge of the nozzle and the main surface of the substrate. In other words, it is possible to provide the opening width of the annular first discharge port in the normal direction such that the opening width is extremely small. Thus, it is possible to increase the flow speed of the liquid discharged from the first discharge port, with the result that it is possible to satisfactorily remove foreign substances such as particles adhered to the main surface of the substrate.

Preferably, the substrate processing apparatus performs, on the substrate, processing using a processing fluid containing the first fluid and a second fluid, where the nozzle further includes a second cylindrical member that surrounds the first cylindrical member and that defines, between the second cylindrical member and the first cylindrical member, a second flow path along which the fluid is passed, in the second cylindrical member, an annular second discharge port is opened through which the fluid flowing through the second flow path is discharged, on the side of the direction apart from the main surface of the substrate with respect to the first discharge port, along the main surface of the substrate radially and the substrate processing apparatus further includes a second fluid supply unit that supplies the second fluid to the second flow path of the nozzle.

According to this configuration, the second fluid is discharged radially along the main surface of the substrate from the annular second discharge port formed on the side of the direction apart from the main surface of the substrate with respect to the first discharge port. The second fluid discharged from the second discharge port covers, from the side of the direction apart from the main surface of the substrate, the first fluid discharged from the first discharge port. A flow of the second fluid is formed on the side of the direction apart from the main surface of the substrate when seen from the first fluid. Thus, it is possible to prevent the first fluid discharged from the first discharge port from flowing toward the direction apart from the main surface of the substrate. In this way, the first fluid can be passed along the main surface of the substrate.

The second discharge port may be defined between a tip end edge of the second cylindrical member and the tip end portion of the first cylindrical member. According to this configuration, since the annular second discharge port is defined and formed by the tip end edge of the second cylindrical member and the tip end portion of the first cylindrical member, it is possible to provide the annular second discharge port with a simple configuration.

The first fluid passed along the first flow path may be a liquid, and the second fluid passed along the second flow path may be a liquid of the same type as the first fluid.

According to this configuration, the liquid is discharged radially from the annular second discharge port formed on the side of the direction apart from the main surface of the substrate with respect to the first discharge port. The liquid discharged from the second discharge port covers, from the side of the direction apart from the main surface of the substrate, the liquid discharged from the first discharge port. A flow of the liquid discharged from the second discharge port is formed on the side of the direction apart from the main surface of the substrate when seen from the liquid discharged from the first discharge port. Thus, it is possible to prevent the liquid discharged from the first discharge port from flowing toward the direction apart from the main surface of the substrate. In this way, the liquid discharged from the first discharge port can be passed along the main surface of the substrate.

When the opening width of the first discharge port is set extremely small, the liquid discharged from the first discharge port is jetted at a high discharge pressure, and is scattered to the surrounding area, with the result that this may cause particle generation. However, since the liquid discharged from the first discharge port is covered by the liquid discharged from the second discharge port, the scattering of the liquid discharged from the first discharge port can be reduced or prevented.

The first fluid passed along the first flow path may be a first liquid, and the second fluid passed along the second flow path may be a second liquid of a different type from the first fluid.

According to this configuration, the second liquid is discharged radially from the second discharge port formed on the side of the direction apart from the main surface of the substrate with respect to the first discharge port. When the opening width of the first discharge port is set extremely small, the first liquid discharged from the first discharge port is jetted at a high discharge pressure, and is scattered to the surrounding area, with the result that this may cause particle generation. However, since the first liquid is covered by the second liquid, the scattering of the first liquid discharged from the first discharge port can be reduced or prevented.

The first fluid passed along the first flow path may be a gas, and the second fluid passed along the second flow path may be a liquid.

According to this configuration, the high-speed gas is blown to the liquid discharged from the second discharge port along the main surface of the substrate. In this way, immediately before the liquid reaches the upper surface of the substrate, the liquid and the gas collide with each other to form droplets of the liquid. The droplets of the liquid formed are supplied to the main surface of the substrate. The droplets form a jet, and the jet is supplied to the main surface of the substrate. By the kinetic energy of the droplets of the liquid, it is possible to physically remove foreign substances from the main surface of the substrate.

According to a second aspect of this invention, there is provided a substrate processing apparatus that performs, on a substrate, processing using a processing fluid containing a first fluid, the substrate processing apparatus including a substrate holding unit which holds the substrate, a nozzle which includes a first cylindrical member within which a first flow path along which the first fluid is passed is formed and in which a tip end edge of the first cylindrical member defines, between the tip end edge and a main surface, an annular first discharge port that discharges the fluid flowing through the first flow path along the main surface of the substrate radially, a nozzle holding unit which holds the nozzle in a state where the tip end edge of the first cylindrical member is opposite to the main surface of the substrate with a space apart therefrom, and a fluid supply unit which supplies the first fluid to the first flow path of the nozzle, where a tip end portion of the first cylindrical member includes an enlarged diameter inner wall whose diameter is enlarged so as to separate from a normal to the main surface of the substrate as the tip end portion approaches the main surface of the substrate.

According to this configuration, the tip end portion of the first cylindrical member includes the enlarged diameter inner wall whose diameter is enlarged so as to separate from the normal as the tip end portion approaches the main surface of the substrate. Hence, in the process in which the first fluid flows through the first flow path toward the first discharge port, a flow in the direction along the main surface of the substrate is formed. Thus, it is possible to increase the flow speed of the first fluid discharged from the first discharge port. In this way, it is possible to increase the flow speed of the first fluid on the main surface of the substrate, with the result that it is possible to satisfactorily remove foreign substances such as particles adhered to the main surface of the substrate.

In a preferred embodiment of this invention, the enlarged diameter inner wall includes a convex curved wall that is extended in a trumpet shape toward the main surface of the substrate.

According to this configuration, since the enlarged diameter inner wall includes the convex curved wall which is extended in a trumpet shape, a turbulent flow is prevented from being generated in the flow of the first fluid from the first flow path to the first discharge port, and thus the first fluid can be smoothly guided toward the first discharge port.

The tip end portion of the first cylindrical member may include a trumpet-shaped portion that is extended toward the main surface of the substrate.

The enlarged diameter inner wall may include a taper wall that is extended toward the main surface of the substrate. According to this configuration, since the enlarged diameter inner wall includes the taper wall that is extended toward the main surface of the substrate, almost no turbulent flow is generated in the flow of the first fluid from the first flow path to the first discharge port, and thus the processing liquid can be relatively smoothly guided toward the first discharge port.

The tip end portion of the first cylindrical member may include a taper portion that is extended toward the main surface of the substrate.

The tip end edge of the first cylindrical member may include a flat surface portion that is extended toward the main surface of the substrate. According to this configuration, the flat surface portion provided at the tip end edge of the first cylindrical member is extended along the main surface of the substrate. The flat surface portion guides the processing liquid discharged from the first discharge port in the direction along the main surface of the substrate. Thus, it is possible to further increase the flow speed of the first fluid discharged from the first discharge port in the direction along the main surface of the substrate, with the result that it is possible to satisfactorily remove foreign substances such as particles adhered to the main surface of the substrate.

The first fluid passed along the first flow path may be a liquid. According to this configuration, the liquid is discharged radially along the main surface of the substrate from the annular first discharge port formed between the main surface of the substrate and the tip end edge of the nozzle. The flow rate of the liquid discharged from the first discharge port is set appropriate, and thus it is possible to provide a gap having an extremely small space between the tip end edge of the nozzle and the main surface of the substrate. In other words, it is possible to provide the opening width of the annular first discharge port in the normal direction such that the opening width is extremely small. Thus, it is possible to increase the flow speed of the liquid discharged from the first discharge port, with the result that it is possible to satisfactorily remove foreign substances such as particles adhered to the main surface of the substrate.

Preferably, the substrate processing apparatus performs, on the substrate, processing using a processing fluid containing the first fluid and a second fluid, where the nozzle further includes a second cylindrical member that surrounds the first cylindrical member and that defines, between the second cylindrical member and the first cylindrical member, a second flow path along which the fluid is passed, in the second cylindrical member, an annular second discharge port is opened through which the fluid flowing through the second flow path is discharged, on the side of the direction apart from the main surface of the substrate with respect to the first discharge port, along the main surface of the substrate radially and the substrate processing apparatus further includes a second fluid supply unit that supplies the second fluid to the second flow path of the nozzle.

According to this configuration, the second liquid is discharged radially along the main surface of the substrate from the annular second discharge port formed on the side of the direction apart from the main surface of the substrate with respect to the first discharge port. The second fluid discharged from the second discharge port covers, from the side of the direction apart from the main surface of the substrate, the first liquid discharged from the first discharge port. A flow of the second liquid is formed on the side of the direction apart from the main surface of the substrate when seen from the first liquid. Thus, it is possible to prevent the first liquid discharged from the first discharge port from flowing toward the direction apart from the main surface of the substrate. In this way, the first fluid can be passed along the main surface of the substrate.

In this case, when the tip end portion of the first cylindrical member includes the trumpet-shaped portion that is extended toward the main surface of the substrate, the following actions and effects are achieved. Specifically, since the tip end portion of the first cylindrical member includes the trumpet-shaped portion that is extended toward the main surface of the substrate, the downstream end portion of the second flow path is formed with a trumpet-shaped concave curved wall. Hence, in the process in which the second fluid flows along the second flow path toward the second discharge port, a flow in the direction along the main surface of the substrate is formed. Moreover, since the concave wall is trumpet-shaped, a turbulent flow is prevented from being generated in the flow of the second fluid from the second flow path to the second discharge port, and thus the second fluid can be smoothly guided toward the second discharge port.

In the case described above, when the tip end portion of the first cylindrical member includes the taper portion that is extended toward the main surface of the substrate, the following actions and effects are achieved. Specifically, since the tip end portion of the first cylindrical member includes the trumpet-shaped portion that is extended toward the main surface of the substrate, the downstream end portion of the second flow path is formed with a tapered concave wall. Hence, in the process in which the second fluid flows along the second flow path toward the second discharge port, a flow in the direction along the main surface of the substrate is formed. Moreover, since the concave wall is tapered, almost no turbulent flow is generated in the flow of the second fluid from the second flow path to the second discharge port, and thus the second fluid can be smoothly guided toward the second discharge port.

The second discharge port may be defined between a tip end edge of the second cylindrical member and the tip end portion of the first cylindrical member. According to this configuration, since the annular second discharge port is defined and formed by the tip end edge of the second cylindrical member and the tip end portion of the first cylindrical member, it is possible to provide the annular second discharge port with a simple configuration.

The first fluid passed along the first flow path may be a liquid, and the second fluid passed along the second flow path may be a liquid of the same type as the first fluid.

According to this configuration, the liquid is discharged radially from the annular second discharge port formed on the side of the direction apart from the main surface of the substrate with respect to the first discharge port. The liquid discharged from the second discharge port covers, from the side of the direction apart from the main surface of the substrate, the liquid discharged from the first discharge port. A flow of the liquid discharged from the second discharge port is formed on the side of the direction apart from the main surface of the substrate when seen from the liquid discharged from the first discharge port. Thus, it is possible to prevent the liquid discharged from the first discharge port from flowing toward the direction apart from the main surface of the substrate. In this way, the liquid discharged from the first discharge port can be passed along the main surface of the substrate.

When the opening width of the first discharge port is set extremely small, the liquid discharged from the first discharge port is jetted at a high discharge pressure, and is scattered to the surrounding area, with the result that this may cause particle generation. However, since the liquid discharged from the first discharge port is covered by the liquid discharged from the second discharge port, the scattering of the liquid discharged from the first discharge port can be reduced or prevented.

The first fluid passed along the first flow path may be a first liquid, and the second fluid passed along the second flow path may be a second liquid of a different type from the first liquid.

According to this configuration, the second liquid is discharged radially from the second discharge port formed on the side of the direction apart from the main surface of the substrate with respect to the first discharge port. When the opening width of the first discharge port is set extremely small, the first liquid discharged from the first discharge port is jetted at a high discharge pressure, and is scattered to the surrounding area, with the result that this may cause particle generation. However, since the first liquid is covered by the second liquid, the scattering of the first liquid discharged from the first discharge port can be reduced or prevented.

The first fluid passed along the first flow path may be a gas, and the second fluid passed along the second flow path may be a liquid.

According to this configuration, the high-speed gas is blown to the liquid discharged from the second discharge port along the main surface of the substrate. In this way, immediately before the liquid reaches the upper surface of the substrate, the liquid and the gas collide with each other to form droplets of the liquid. The droplets of the liquid formed are supplied to the main surface of the substrate. The droplets form a jet, and the jet is supplied to the main surface of the substrate. By the kinetic energy of the droplets of the liquid, it is possible to physically remove foreign substances from the main surface of the substrate.

The objects, the features and the effects in the present invention described above or still other objects, features and effects will be more apparent from the following description of preferred embodiments with reference to the accompanying drawings.

DETAILED DESCRIPTION OF PREFERRED EMBODIMENTS

Figure 1:
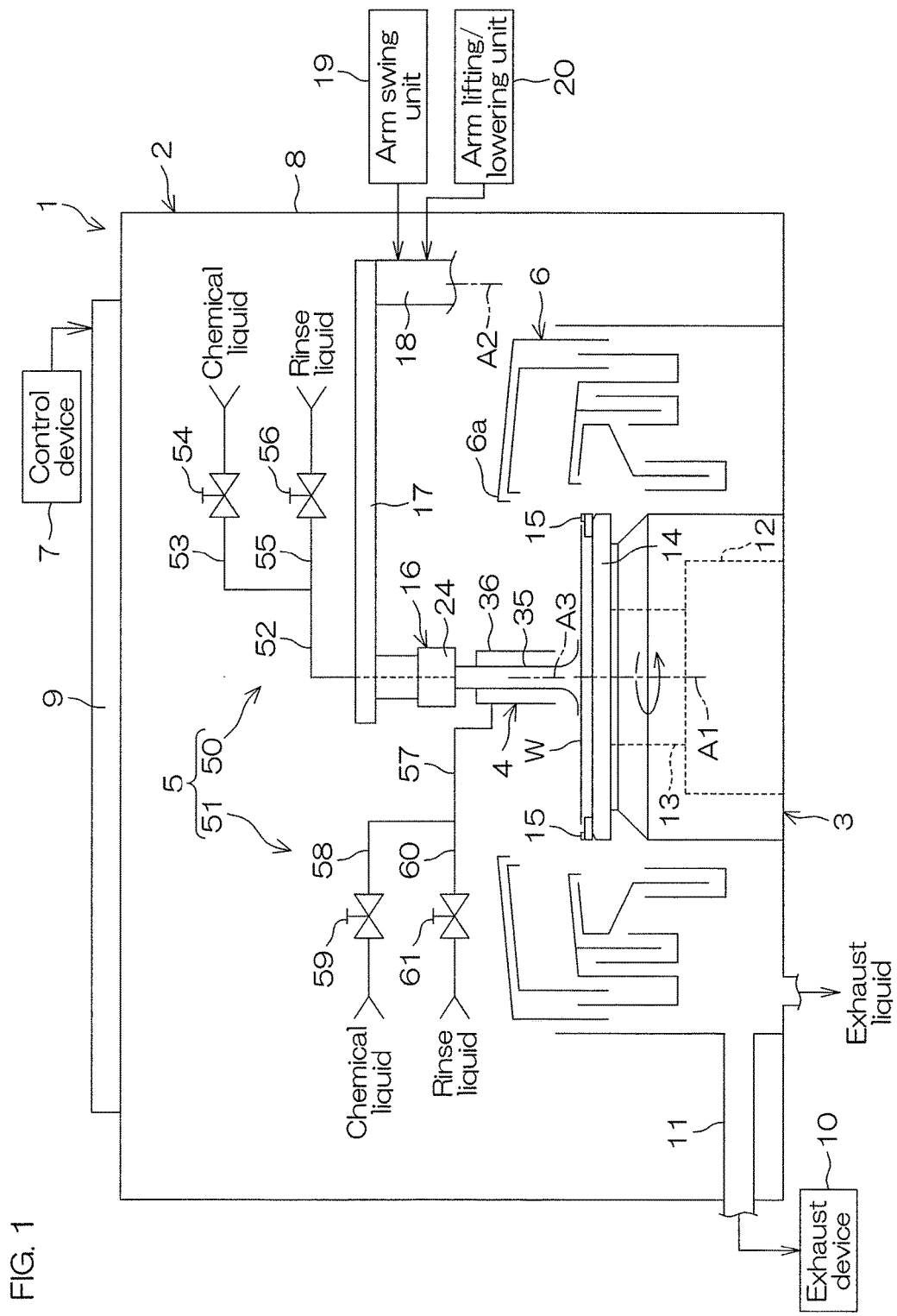
FIG. 1 is a diagram when a substrate processing apparatus according to a first preferred embodiment of the present invention is seen in a horizontal direction.

FIG. 1 is a diagram when a substrate processing apparatus 1 according to a first preferred embodiment of the present invention is seen in a horizontal direction.

The substrate processing apparatus 1 is a single substrate processing type apparatus for performing chemical liquid processing (such as cleaning processing and etching processing) using a processing liquid (a processing fluid) on the front surface of a substrate W such as a circular semiconductor wafer on the side of a device formation region. The substrate processing apparatus 1 includes a box-shaped chamber 2 that has an internal space, a spin chuck (substrate holding unit) 3 that holds, within the chamber 2, one substrate W in a horizontal position and that rotates the substrate W about a vertical rotation axis A1 passing through the center of the substrate W, a nozzle 4 for discharging the processing liquid to the upper surface of the substrate W held by the spin chuck 3, a processing fluid supply unit 5 for supplying the processing liquid to the nozzle 4, a cylindrical processing cup 6 that surrounds the spin chuck 3 and a control device 7 that controls the operation of a device included in the substrate processing apparatus 1 and the opening and closing of a valve.

The chamber 2 includes a box-shaped partition wall 8, a FFU (fan filter unit) 9 that serves as a blower unit which blows clean air from an upper portion of the partition wall 8 into the partition wall 8 (which corresponds to the interior of the chamber 2) and an exhaust device 10 that exhausts a gas within the chamber 2 from a lower portion of the partition wall 8. The spin chuck 3 and the nozzle 4 are accommodated and arranged within the partition wall 8.

The FFU 9 is arranged on the partition wall 8 and is attached to the ceiling of the partition wall 8. The FFU 9 blows the clean air into the chamber 2 from the ceiling of the partition wall 8. The exhaust device 10 is connected via an exhaust duct 11 connected to the interior of the processing cup 6 to the bottom portion of the processing cup 6, and sucks the interior of the processing cup 6 from the bottom portion of the processing cup 6. The FFU 9 and the exhaust device 10 form a downflow (downward flow) within the chamber 2.

As the spin chuck 3, a clamping-type chuck is adopted that clamps the substrate W in a horizontal direction to hold the substrate W horizontally. Specifically, the spin chuck 3 includes a spin motor (substrate rotation unit) 12, a spin shaft 13 that is integral with the drive shaft of the spin motor 12 and a disc-shaped spin base 14 that is attached to an upper end of the spin shaft 13 substantially horizontally.

On the upper surface of the spin base 14, a plurality of (three or more, for example, six) clamping members 15 are arranged on the circumferential edge portion thereof. The clamping members 15 are arranged with an appropriate space apart in an upper surface circumferential edge portion of the spin base 14 on the circumference corresponding to the outer circumferential shape of the substrate W.

The spin chuck 3 is not limited to the clamping type, and for example, a vacuum adsorption type (vacuum chuck) may be adopted that vacuum-adsorbs the rear surface of the substrate W to hold the substrate W in a horizontal position and that is rotated about a vertical rotation axis in such a state to rotate the substrate W held by the spin chuck 3.

The nozzle 4 has a basic form as a scan nozzle that can change the supply position of the processing liquid on the upper surface of the substrate W. The nozzle 4 is attached to a tip end portion of a nozzle arm (support member) 17 that is extended substantially horizontally above the spin chuck 3. The nozzle arm 17 is supported by an arm support shaft 18 that is extended substantially vertically on the side of the spin chuck 3. An arm swing unit 19 formed with a motor and the like is coupled to the arm support shaft 18. The nozzle arm 17 can be swung by the arm swing unit 19 within a horizontal plane about a vertical swing axis A2 set on the side of the spin chuck 3, and thus the nozzle 4 can be rotated about the swing axis A2. An arm lifting/lowering unit 20 that is formed with a servomotor, a ball screw mechanism and the like is coupled to the arm support shaft 18. The arm support shaft 18 is lifted and lowered by the arm lifting/lowering unit 20, and thus the nozzle arm 17 can be lifted and lowered integrally with the arm support shaft 18. In this way, the nozzle 4 can be lifted and lowered between a lower position that is opposite to the upper surface of the substrate W whose lower end edge is held by the spin chuck 3 with a predetermined space W2 (for example, 5 mm, see FIG. 2) and an upper position that is significantly retracted upward of the substrate W held by the spin chuck 3. As described above, the arm lifting/lowering unit 20 forms an approach/separation drive mechanism for bringing the nozzle 4 close to and away from the substrate W.

The nozzle 4 is supported by the nozzle arm 17 via a nozzle holding unit (nozzle holding unit) 16.

Figure 2:
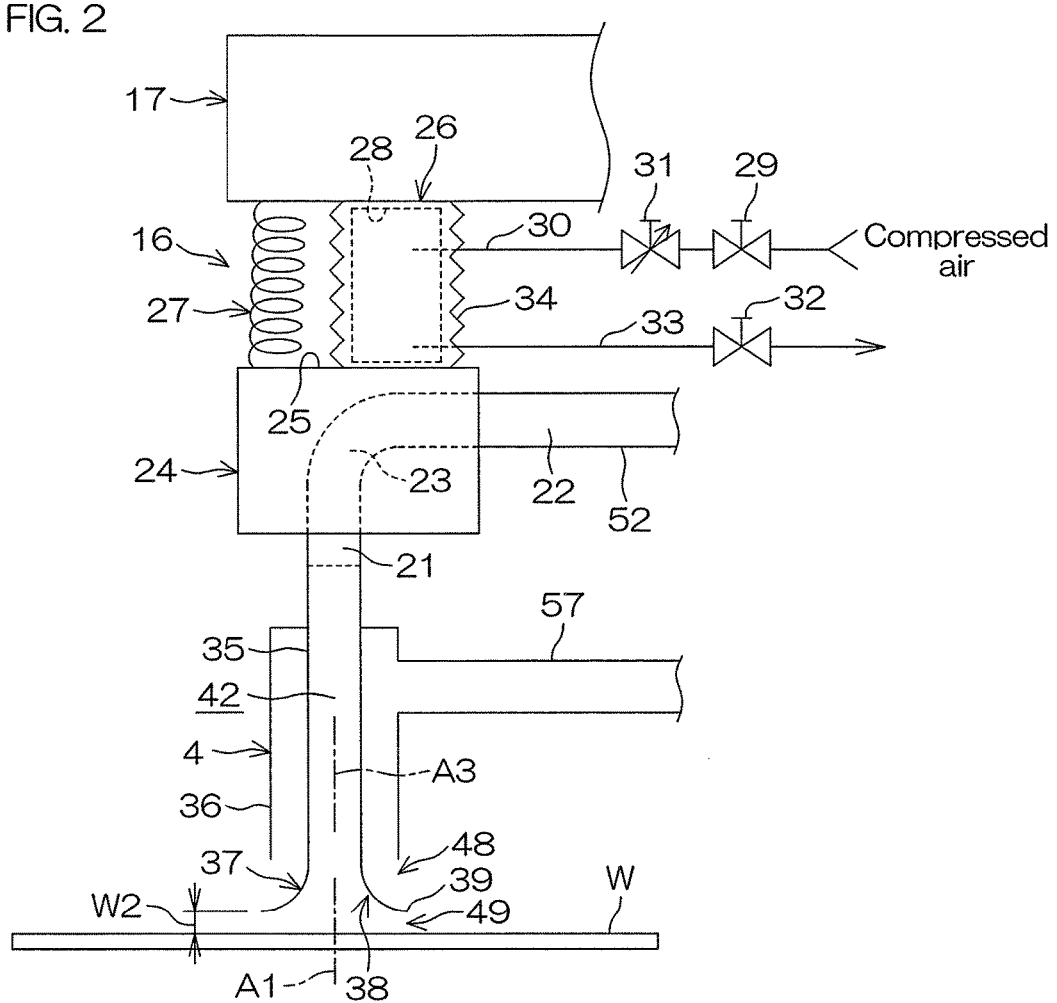
FIG. 2 is a diagram schematically showing the configuration of a nozzle holding unit and a nozzle included in the substrate processing apparatus.

FIG. 2 is a diagram schematically showing the configuration of the nozzle holding unit 16 and the nozzle 4.

As shown in FIG. 2, a first processing liquid pipe 52 that is connected to the inner cylinder 35 of the nozzle 4, which will be described later, integrally includes a vertical pipe portion 21 that is extended in a vertical direction and a horizontal pipe portion 22 that is bent from an upper end portion of the vertical pipe portion 21 and that is extended in a horizontal direction. A connection portion 23 between the vertical pipe portion 21 and the horizontal pipe portion 22 penetrate the interior of a holder 24, and thus the first processing liquid pipe 52 is fixed to the holder 24. The holder 24 has an upper surface 25. Between the lower surface of the nozzle arm 17 and the upper surface 25 of the holder 24, an air cylinder (first load application unit) 26 and a coil spring (second load application unit) 27 are interposed. In the first preferred embodiment, the nozzle holding unit 16 includes the holder 24, the air cylinder 26 and the coil spring 27.

As shown in FIG. 2, the coil spring 27 is a tension coil spring. The upper end and the lower end of the coil spring 27 are respectively fixed to the lower surface of the nozzle arm 17 and the upper surface 25 of the holder 24. The coil spring 27 pulls the nozzle 4 and the holder 24 upward. In other words, the coil spring 27 applies an upward force (separation direction force) to the nozzle 4.

As shown in FIG. 2, the air cylinder 26 is a cylinder that includes an extension and contraction portion 28 capable of extending and contracting. As the extension and contraction portion 28, for example, an extension and contraction rod can be illustrated that can be extended and contracted in a longitudinal direction. The extension and contraction portion 28 is arranged in a vertical position. An air supply pipe 30 is connected to the interior of the extension and contraction portion 28 via an air supply valve 29. In the air supply pipe 30, an air adjustment valve (load adjustment unit) 31 for adjusting the degree of opening of the air supply pipe 30 is interposed. A leak pipe 33 is connected to the interior of the extension and contraction portion 28 via a leak valve (load adjustment unit) 32. The extension and contraction portion 28 is extended by the introduction of compressed air into its interior, and is contracted by the removal of the compressed air from the interior. The vertical height of the extension and contraction portion 28 (which is substantially equal to that of the air cylinder 26) in the most contracted state of the extension and contraction portion 28 is set shorter than the length of the coil spring 27 in a state where the holder 24 is suspended from the coil spring 27. Hence, in the most contracted state of the extension and contraction portion 28, the lower end portion of the extension and contraction portion 28 is not in contact with the upper surface 25 of the holder 24. When in the most contracted state of the extension and contraction portion 28, the air supply valve 29 is opened while the leak valve 32 is being closed, the compressed air is passed through the air supply pipe 30 and is supplied into the extension and contraction portion 28. In this way, the extension and contraction portion 28 is extended, and when the length of the extension and contraction portion 28 becomes equal to that of the coil spring 27, the lower end portion of the extension and contraction portion 28 makes contact with the upper surface 25 of the holder 24. The supply of the compressed air is further continued, and thus the extension and contraction portion 28 is further extended from its state against the spring force of the coil spring 27. In this way, the lower end portion of the extension and contraction portion 28 presses the holder 24 downward, and thus the holder 24 is lowered. In this way, the space between the lower surface of the nozzle arm 17 and the upper surface 25 of the holder 24 is enlarged.

In the extended state of the extension and contraction portion 28, the leak valve 32 is opened, and thus the compressed air is removed from the interior of the extension and contraction portion 28, and accordingly, the extension and contraction portion 28 is contracted and is returned to the most contracted state.

The surrounding area of the extension and contraction portion 28 is surrounded by a bellows 34 formed of a resin material having a chemical resistance. The bellows 34 is extended and contracted as the space between the lower surface of the nozzle arm 17 and the upper surface 25 of the holder 24 is increased and decreased.

Figure 3:
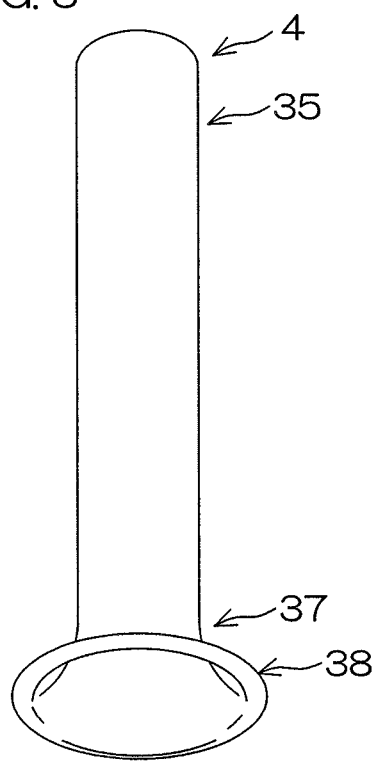
FIG. 3 is a cross-sectional view schematically showing the configuration of a first cylindrical member included in the nozzle.
Figure 4:
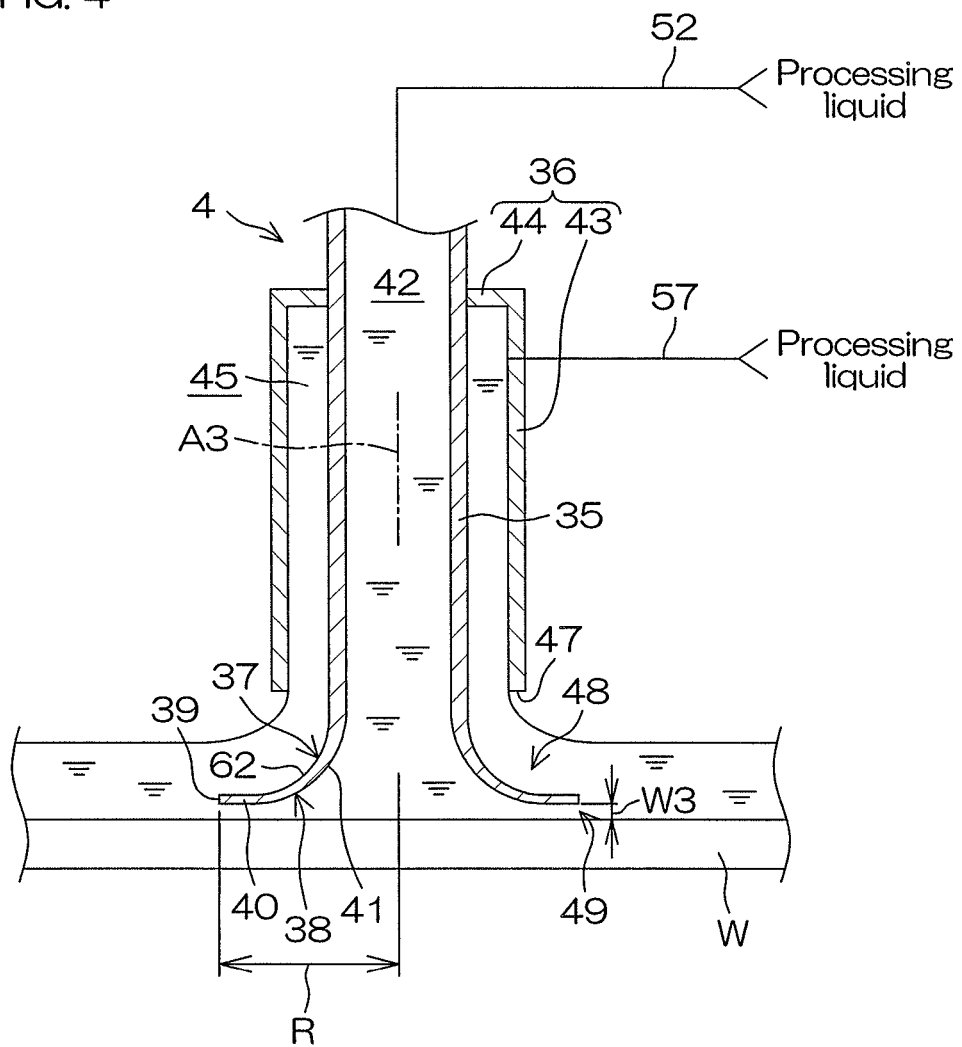
FIG. 4 is an enlarged cross-sectional view showing the nozzle in a state where the nozzle discharges a processing liquid.

FIG. 3 is a cross-sectional view schematically showing the configuration of the inner cylinder 35 included in the nozzle 4. FIG. 4 is an enlarged cross-sectional view showing the nozzle 4 in a state where the nozzle 4 discharges the processing liquid. With reference to FIGS. 2 and 4, the configuration of the nozzle 4 will be described. FIG. 3 will be described as necessary.

The nozzle 4 includes an inner cylinder (first cylindrical member) 35 and an outer cylinder (second cylindrical member) 36 that is externally fitted to the inner cylinder 35 and that encloses the inner cylinder 35. The inner cylinder 35 and the outer cylinder 36 are arranged coaxially on a common vertical axis A3. As shown in FIG. 3, the inner cylinder 35 is cylindrical except a lower end portion (tip end portion) 37. The lower end portion 37 of the inner cylinder 35 includes a trumpet-shaped portion 38 that is extended downward. In other words, the lower end portion 37 of the inner cylinder 35 includes a convex curved wall 41 that is extended downward in the shape of a trumpet. Furthermore, in other words, the lower end portion 37 of the inner cylinder 35 includes an enlarged diameter inner wall whose diameter is enlarged so as to separate from the vertical axis A3 as the lower end portion 37 is extended downward. The circumferential edge portion (tip end edge) 39 of the trumpet-shaped portion 38 includes a flat plate-shaped portion (flat surface portion) 40 that is extended along the horizontal direction. The circumferential edge portion 39 of the trumpet-shaped portion 38 is extended, in a plan view, outward of the outer cylinder 36 in a radial direction. The internal space of the inner cylinder 35 serves as a straight first flow path 42 along which the processing liquid from the first processing liquid pipe 52, which will be described later, is passed.

As shown in FIGS. 2 and 4, the outer cylinder 36 includes a cylindrical portion 43 and a closing portion 44 that closes an upper end portion of the cylindrical portion 43. An area between the outer circumference of the inner cylinder 35 and the inner circumference of the closing portion 44 is sealed with a seal member (not shown) in a liquid-tight manner. Between the inner cylinder 35 and the cylindrical portion 43 of the outer cylinder 36, a second flow path 45 is formed along which the processing liquid from a second processing liquid pipe 57, which will be described later, is passed. The inner cylinder 35 and the outer cylinder 36 are individually formed of a resin material such as polyvinyl chloride, PCTFE (polychlorotrifluoroethylene), PVDF (polyvinylidene fluoride), PTFE (polytetrafluoroethylene) or PFA (perfluoro-alkylvinyl-ether-tetrafluoro-ethlene-copolymer)

As shown in FIGS. 2 and 4, in the lower end portion of the outer cylinder 36, an annular upper discharge port (second discharge port) 48 is defined by a lower end edge 47 (tip end edge) of the outer cylinder 36 and the lower end portion 37 of the inner cylinder 35. The upper discharge port 48 is a lateral discharge port, and discharges the processing liquid passed along the second flow path 45 radially in the horizontal direction.

Since the lower end portion 37 of the inner cylinder 35 includes the trumpet-shaped portion 38 that is extended toward the upper surface of the substrate W, the downstream end portion of the second flow path 45 is formed with a trumpet-shaped concave curved wall 62. Hence, in the process in which the processing liquid flows along the second flow path 45 toward the upper discharge port 48, a flow in the horizontal direction is formed. Moreover, since the concave curved wall 62 is trumpet-shaped, a turbulent flow is prevented from being generated in the flow of the processing liquid from the second flow path 45 to the upper discharge port 48, and thus the processing liquid can be smoothly guided toward the upper discharge port 48.

The processing liquid is passed along the second flow path 45 toward the upper discharge port 48, and thus the processing liquid presses the trumpet-shaped portion 38 downward. In other words, a downward force (approach direction force) is applied to the nozzle 4 by the processing liquid passed along the second flow path 45.

When processing is performed by the substrate processing apparatus 1 on the substrate W, the nozzle 4 is arranged in the lower position by the swinging and the lifting and lowering of the nozzle arm 17. In this state, the processing liquid is discharged from the trumpet-shaped portion 38 of the nozzle 4. When in this state, the nozzle 4 is further lowered to a close position which is much lower than the lower position, as shown in FIG. 4, between the circumferential edge portion 39 of the trumpet-shaped portion 38 and the upper surface of the substrate W, an annular lower discharge port (first discharge port) 49 is defined.

As shown in FIGS. 2 and 4, the lower discharge port 49 discharges the processing liquid flowing through the first flow path 42 radially in the horizontal direction. Then, the height position of the nozzle 4 in the vertical direction is held in such a position that a downward force (the resultant force of a downward force produced by the own weight of the nozzle 4, the holder 24 and the like, a downward force produced by the air cylinder 26 and a force with which the processing liquid passed along the second flow path 45, which will be described later, presses the trumpet-shaped portion 38 downward) is in balance with an upward force (an upward force produced by the pulling of the coil spring 27 and an upward force produced by the discharge of the first fluid from the lower discharge port 49). In this case, the flow rate of the processing liquid discharged from the lower discharge port 49 and the flow rate of the compressed air toward the air cylinder 26 are set such that the space between the lower end edge of the nozzle 4 and the upper surface of the substrate W is extremely small. Hence, an opening width in the vertical direction (hereinafter simply referred to as an "opening width") W3 in the annular lower discharge port 49 is set extremely small.

A downward load is provided to the nozzle 4 from the air cylinder 26 included in the nozzle holding unit 16, and an upward load is provided from the coil spring 27 included in the nozzle holding unit 16. Then, the magnitude of the downward load provided to the nozzle 4 from the air cylinder 26 is adjusted by the extension and contraction portion 28 included in the air cylinder 26. In this way, it is possible to accurately adjust the opening width W3 of the lower discharge port 49.

By adjusting the magnitude of the load provided to the nozzle 4 from the air cylinder 26, it is possible to adjust the opening width W3 of the lower discharge port 49. Hence, the flow rate of the processing liquid discharged from the nozzle 4 is not constrained so that the opening width W3 of the lower discharge port 49 is adjusted. Therefore, the flow rate of the processing liquid discharged from the nozzle 4 can be reduced to a small amount, and in this case, it is also possible to reduce the processing liquid.

As shown in FIG. 1, the processing fluid supply unit 5 includes a first processing liquid supply unit (first fluid supply unit) 50 for supplying the processing liquid to the first flow path 42 of the nozzle 4 and a second processing liquid supply unit (second fluid supply unit) 51 for supplying the processing liquid to the second flow path 45 of the nozzle 4. In this preferred embodiment, as the processing liquid, SC1 (ammonia-hydrogen peroxide mixture) which is an example of the chemical liquid (cleaning chemical liquid) and a rinse liquid are used. The first processing liquid supply unit 50 includes the first processing liquid pipe 52 that supplies the processing liquid to the first flow path 42 (see FIG. 2) of the nozzle 4, a first chemical liquid pipe 53 that supplies the chemical liquid (SC1) from a chemical liquid supply source to the first processing liquid pipe 52, a first chemical liquid valve 54 that opens and closes the first chemical liquid pipe 53, a first rinse liquid pipe 55 that supplies the rinse liquid' from a rinse liquid supply source to the first processing liquid pipe 52 and a first rinse liquid valve 56 that opens and closes the first rinse liquid pipe 55.

The second processing liquid supply unit 51 includes a second processing liquid pipe 57 that supplies the processing liquid to the second flow path 45, a second chemical liquid pipe 58 that supplies the chemical liquid (SC1) from the chemical liquid supply source, a second chemical liquid valve 59 that opens and closes the second chemical liquid pipe 58, a second rinse liquid pipe 60 that supplies the rinse liquid from the rinse liquid supply source to the second processing liquid pipe 57 and a second rinse liquid valve 61 that opens and closes the second rinse liquid pipe 60.

As the rinse liquid, DIW (deionized water), carbonated water, electrolytic ionic water, ozone water, hydrochloric acid water having a dilute concentration (for example, about 10 to 100 ppm), reduced water (hydrogen water), degassed water or the like can be used.

In a state where the first rinse liquid valve 56 and the second rinse liquid valve 61 are closed, the first chemical liquid valve 54 and the second chemical liquid valve 59 are opened, and thus the chemical liquid (SC1) is supplied both to the first flow path 42 and the second flow path 45 of the nozzle 4. In this way, it is possible to simultaneously discharge the chemical liquid (SC1) both from the lower discharge port 49 and from the upper discharge port 48.

In a state where the first chemical liquid valve 54 and the second chemical liquid valve 59 are closed, the first rinse liquid valve 56 and the second rinse liquid valve 61 are opened, and thus the rinse liquid is supplied both to the first flow path 42 and the second flow path 45 of the nozzle 4. In this way, it is possible to simultaneously discharge the rinse liquid both from the lower discharge port 49 and the upper discharge port 48.

As shown in FIG. 1, the processing cup 6 is arranged outside (direction away from the rotation axis A1) the substrate W held by the spin chuck 3. The processing cup 6 surrounds the spin base 14. When in a state where the spin chuck 3 rotates the substrate W, the processing liquid is supplied to the substrate W, the processing liquid supplied to the substrate W is spun off to the surrounding area of the substrate W. When the processing liquid is supplied to the substrate W, an upper end portion 6*a* of the processing cup 6, which is opened upward, is arranged above the spin base 14. Hence, the processing liquid such as the chemical liquid and water discharged to the surrounding area of the substrate W is received by the processing cup 6. Then, the processing liquid received by the processing cup 6 is fed to a collection device or a waste liquid device that is not shown.

Figure 5:
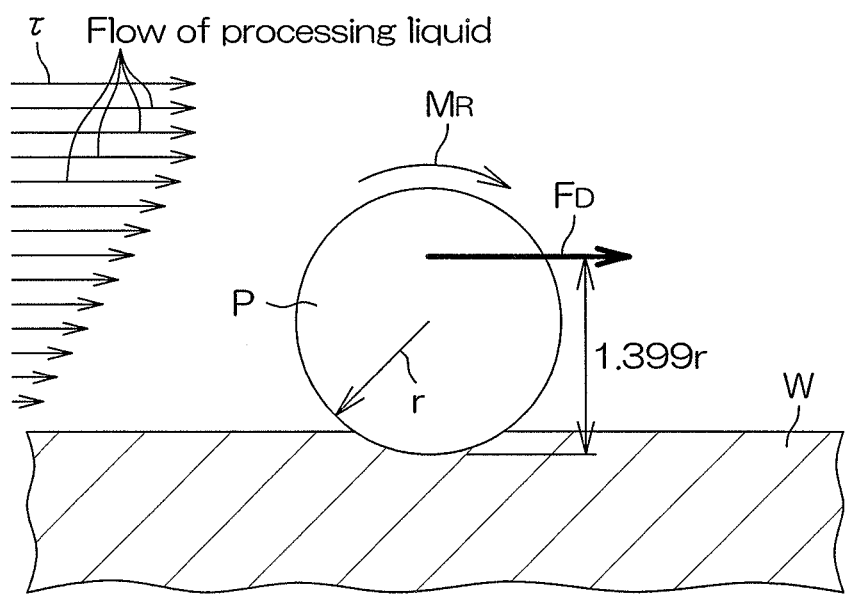
FIG. 5 is a diagram schematically showing a relationship between a removal moment and a lateral flow speed of the processing liquid.

FIG. 5 is a diagram schematically showing a relationship between the removal moment and the lateral flow speed of the processing liquid.

The inventors of the present application have found that the removal moment $M_R$ for removing particles P adhered to the upper surface of the substrate W depends on a lateral force (hereinafter referred to as a "particle removal force $F_D$") applied to the particles P. The inventors of the present application consider that when the processing liquid (for example, the cleaning chemical liquid) is supplied to the upper surface of the substrate W, the particle removal force $F_D$ depends on the flow speed of the processing liquid flowing in the vicinity of the particles P.

The particle removal force $F_D$ can be expressed by formula (1) below.

$$F_D = 32 \cdot \mu / \rho \cdot (r/v)^2 \cdot 2\tau/\rho \quad \text{formula (1)}$$

(where in formula (1), μ represents the viscosity of the processing liquid, ρ represents the density of the processing liquid, r represents the radius of the particle P, v represents the kinetic viscosity of the processing liquid and τ represents the lateral flow speed of the processing liquid.)

The particles P are adhered to the vicinity of the front surface of the substrate W. In other words, the removal moment $M_R$ can be considered to depend on the lateral flow speed τ of the processing liquid in the vicinity of the front surface of the substrate W.

Figure 6:
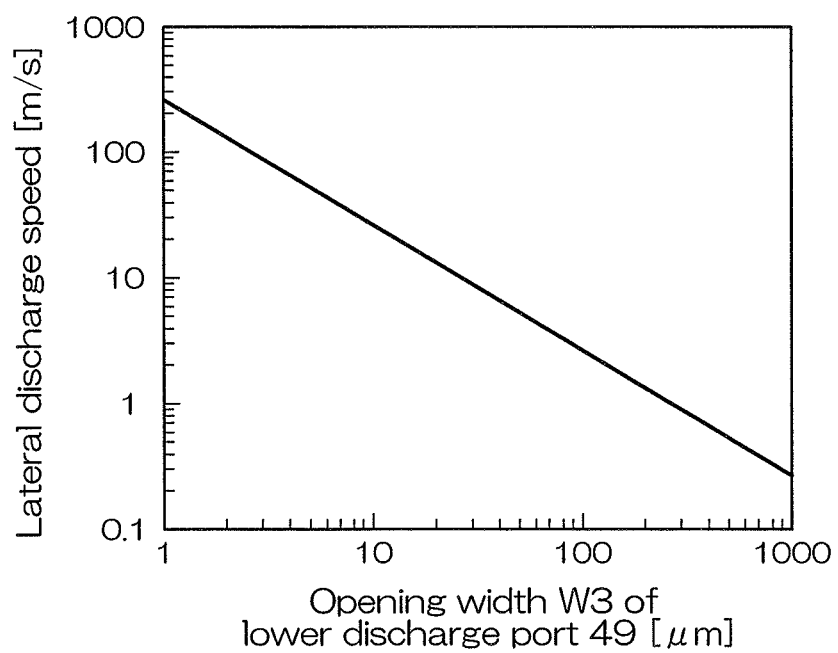
FIG. 6 is a graph showing a relationship between the opening width of a lower discharge port and a lateral discharge speed from the lower discharge port.

FIG. 6 is a graph showing a relationship between the opening width W3 of the lower discharge port 49 and a lateral discharge speed from the lower discharge port 49.

When the radius of the annual lower discharge port 49, that is, the radius of the trumpet-shaped portion 38 (see FIG. 4), is assumed to be R (see FIG. 4), the opening area S of the lower discharge port 49 can be expressed by formula (2) below.

$$S = 2 \cdot \pi \cdot R \cdot W3 \quad \text{formula (2)}$$

In this case, when the flow rate τ of the processing liquid passed along the first flow path 42 per unit time is assumed to be f (not shown), the flow rate τ (not shown) of the processing liquid in the lower discharge port 49 can be expressed by formula (3) below.

$$\tau = f/(2 \cdot \pi \cdot R \cdot W3) \quad \text{formula (3)}$$

In other words, as the opening width W3 of the lower discharge port 49 is decreased, the flow speed of the processing liquid in the lower discharge port 49 can be increased.

The following is found from FIGS. 5 and 6. When the lower discharge port 49 is set to an extremely small space, the processing liquid discharged from the lower discharge port 49 is directly applied to the particles P. Then, the lateral flow speed of the processing liquid in the lower discharge port 49, that is, the discharge speed of the processing liquid from the lower discharge port 49, is increased, and thus the removal moment $M_R$ applied to the particles P can be enhanced. In this way, it is possible to satisfactorily remove the particles P from the front surface of the substrate W.

The control device 7 is formed with, for example, a microcomputer. As targets to be controlled, the spin motor 12, the arm swing unit 19, the arm lifting/lowering unit 20, the exhaust device 10, the first chemical liquid valve 54, the first rinse liquid valve 56, the second chemical liquid valve 59, the second rinse liquid valve 61 and the like are connected to the control device 7. The control device 7 controls, according to a predetermined program, the operations of the spin motor 12, the arm swing unit 19, the arm lifting/lowering unit 20, the exhaust device 10 and the like. Furthermore, the control device 7 controls, for example, the open/close operations of the first chemical liquid valve 54, the first rinse liquid valve 56, the second chemical liquid valve 59, the second rinse liquid valve 61 and the like.

Figure 7:
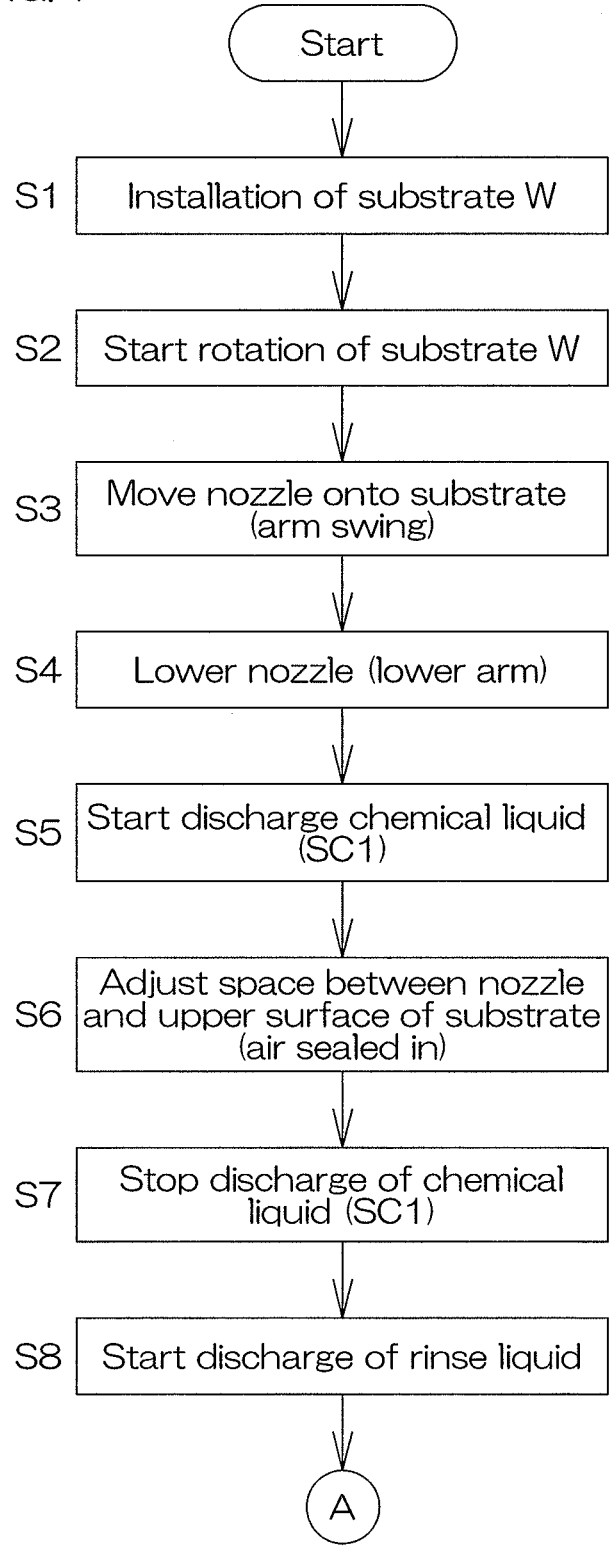
FIG. 7 is a flowchart for illustrating an example of cleaning processing performed in the substrate processing apparatus.
Figure 8:
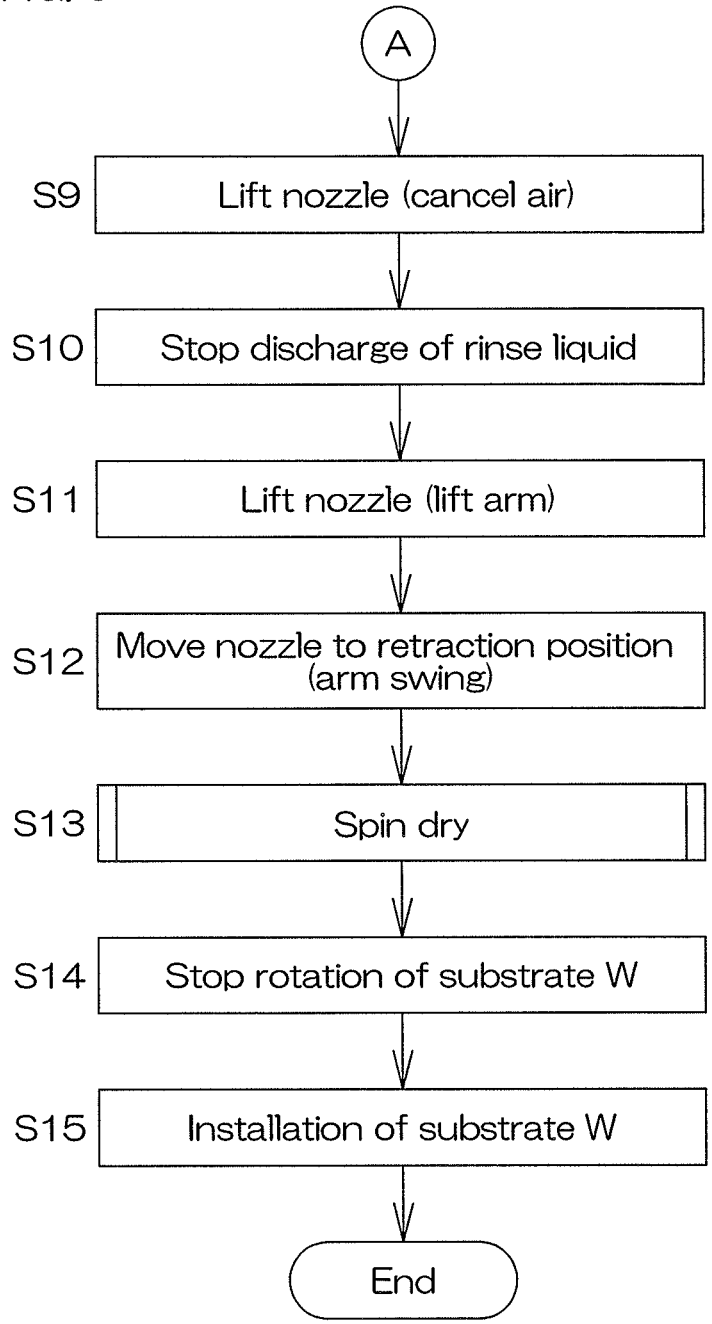
FIG. 8 is a flowchart for illustrating the example of the cleaning processing performed in the substrate processing apparatus.

FIGS. 7 and 8 are flowcharts for illustrating an example of the cleaning processing performed in the substrate processing apparatus 1.

The example of the cleaning processing will be described below with reference to FIGS. 1, 2, 4, 7 and 8. In the cleaning processing, as the chemical liquid (cleaning chemical liquid), the SC1 is used.

In the cleaning processing, the unwashed substrate W is transported into the chamber 2 (step S1). The substrate W is fed to the spin chuck 3 in a state where its front surface (device formation surface) is faced upward. Specifically, in a state where the nozzle 4 is arranged in a retraction position where the nozzle 4 is retracted from above the spin chuck 3, the control device 7 makes the hand (not shown) of a substrate transfer robot (not shown) holding the substrate W enter the chamber 2. In this way, in a state where the main surface of the substrate W to be processed is faced upward, the substrate W is fed to the spin chuck 3 and is held by the spin chuck 3 (substrate holding step).

After the substrate is held by the spin chuck 3, the control device 7 starts the rotation of the substrate W by the spin motor 12 (step S2). The substrate W is increased to a predetermined liquid processing speed (for example, about 300 rpm), and is maintained at such a liquid processing speed.

When the substrate W reaches the liquid processing speed, then the control device 7 controls the arm swing unit 19 to draw the nozzle 4 from the retraction position to above the substrate W (step S3).

After the nozzle 4 is arranged above the substrate W, then the control device 7 controls the arm lifting/lowering unit 20 to lower the nozzle 4 to the lower position (step S4).

When the nozzle 4 is arranged in the lower position, the control device 7 opens the first chemical liquid valve 54 and the second chemical liquid valve 59. In this way, the discharge of the SC1 from the nozzle 4 is started (step S5), and the SC1 is discharged both from the lower discharge port 49 and the upper discharge port 48 in the nozzle 4.

Then, the control device 7 opens the air supply valve 29 to supply the compressed air into the air cylinder 26. In this way, the extension and contraction portion 28 is extended, and thus the nozzle 4 is further lowered from the lower position. Then, as shown in FIG. 4, the nozzle 4 is held in such a position that the downward force (the resultant force of the downward force produced by the own weight of the nozzle 4, the holder 24 and the like, the downward force produced by the air cylinder 26 and the force with which the SC1 passed along the second flow path 45 presses the trumpet-shaped portion 38 downward) is in balance with the upward force (the upward force produced by the pulling of the coil spring 27 and the upward force produced by the discharge of the SC1 from the lower discharge port 49).

The control device 7 controls the air adjustment valve 31 and thereby previously adjusts the amount of compressed air supplied into the extension and contraction portion 28 of the air cylinder 26 such that the opening width W3 of the annual lower discharge port 49 is extremely small (adjusts the downward force applied to the nozzle 4). Since the opening width W3 is acquired by the discharge pressure of the SC1 discharged from the lower discharge port 49, the space (opening width W3) between the upper surface of the substrate W and the lower end surface of the nozzle 4 is small but is prevented from becoming zero. Since the circumferential edge portion 39 of the trumpet-shaped portion 38 includes the flat plate-shaped portion 40 extending along the horizontal direction, the SC1 is discharged from the lower discharge port 49 in the horizontal direction.

The opening width W3 of the lower discharge port 49 is set extremely small. Moreover, since the lower end portion 37 of the inner cylinder 35 includes the enlarged diameter inner wall whose diameter is enlarged so as to separate from the vertical axis A3 as the lower end portion 37 is extended downward, in the process in which the SC1 flows along the first flow path 42 toward the lower discharge port 49, a lateral flow is formed. Moreover, since the enlarged diameter inner wall includes the convex curved wall 41 which is extended in a trumpet shape, a turbulent flow is prevented from being generated in the flow of the SC1 from the first flow path 42 to the lower discharge port 49, and thus the SC1 can be smoothly guided toward the lower discharge port 49. In this way, the flow speed of the SC1 discharged from the annular lower discharge port 49 of the nozzle 4 in the horizontal direction is extremely high. Hence, it is possible to more satisfactorily remove foreign substances such as particles adhered to the upper surface of the substrate W.

Moreover, the flat plate-shaped portion 40 provided in the circumferential edge portion 39 of the trumpet-shaped portion 38 guides, in the horizontal direction, the SC1 discharged from the lower discharge port 49. Hence, the flow speed of the SC1 discharged from the lower discharge port 49 is further increased in the horizontal direction.

The SC1 is discharged radially in the horizontal direction from the annular upper discharge port 48 arranged adjacent to above the lower discharge port 49. The SC1 discharged from the upper discharge port 48 covers, from the upper side, the SC1 discharged from the lower discharge port 49, and thus on the upper side of the SC1 discharged from the lower discharge port 49, a flow of the SC1 discharged from the upper discharge port 48 is formed. Hence, the SC1 discharged from the lower discharge port 49 is prevented from flowing upward. In this way, the SC1 discharged from the lower discharge port 49 can be passed in the horizontal direction.

When the opening width W3 of the lower discharge port 49 is set extremely small, the SC1 discharged from the lower discharge port 49 is jetted at a high discharge pressure, and is scattered to the surrounding area, with the result that this may cause particle generation. However, since the SC1 discharged from the lower discharge port 49 is covered by the SC1 discharged from the upper discharge port 48, the scattering of the SC1 discharged from the lower discharge port 49 can be prevented.

The control device 7 controls the arm swing unit 19 to move the supply position of the SC1 from the lower discharge port 49 on the upper surface of the substrate W, between the center portion and the circumferential edge portion. In this way, with the supply position of the SC1 from the lower discharge port 49, it is possible to scan the entire region of the upper surface of the substrate W. Thus, it is possible to satisfactorily remove particles from the entire region of the upper surface of the substrate W. The SC1 supplied to the upper surface of the substrate W is scattered from the circumferential edge portion of the substrate W toward the side of the substrate W.

When a predetermined period has elapsed since the start of the discharge of the SC1 from the nozzle 4, the control device 7 closes the first chemical liquid valve 54 and the second chemical liquid valve 59. In this way, the discharge of the SC1 from the nozzle 4 is stopped (step S7). The control device 7 also opens the first rinse liquid valve 56 and the second rinse liquid valve 61. In this way, the processing liquid discharged from the lower discharge port 49 and the upper discharge port 48 of the nozzle 4 is switched from the SC1 to the rinse liquid. In other words, the discharge of the rinse liquid from the nozzle 4 is started (step S8). As described previously, the opening width W3 of the lower discharge port 49 is set extremely small. Hence, the flow speed of the rinse liquid discharged from the lower discharge port 49 of the nozzle 4 is extremely high. Therefore, in the vicinity of the lower discharge port 49, the SC1 left on the upper surface of the substrate W can be satisfactorily washed out from the upper surface of the substrate W.

The rinse liquid is also discharged radially in the horizontal direction from the annular upper discharge port 48 arranged adjacent to above the lower discharge port 49. The rinse liquid discharged from the upper discharge port 48 covers, from the upper side, the rinse liquid discharged from the lower discharge port 49, and thus on the upper side of the rinse liquid discharged from the lower discharge port 49, a flow of the rinse liquid discharged from the upper discharge port 48 is formed. Hence, the rinse liquid discharged from the lower discharge port 49 is prevented from flowing upward. In this way, the rinse liquid discharged from the lower discharge port 49 can be passed in the horizontal direction.

When the opening width W3 of the lower discharge port 49 is set extremely small, the rinse liquid discharged from the lower discharge port 49 is jetted at a high discharge pressure, and is scattered to the surrounding area, with the result that this may cause particle generation. However, since the rinse liquid discharged from the lower discharge port 49 is covered by the rinse liquid discharged from the upper discharge port 48, the scattering of the rinse liquid discharged from the lower discharge port 49 can be prevented.

The control device 7 controls the arm swing unit 19 to move the supply position of the rinse liquid from the lower discharge port 49 on the upper surface of the substrate W, between the center portion and the circumferential edge portion. In this way, with the supply position of the rinse liquid from the lower discharge port 49, it is possible to scan the entire region of the upper surface of the substrate W. Thus, it is possible to satisfactorily remove particles from the entire region of the upper surface of the substrate W. The rinse liquid supplied to the upper surface of the substrate W is scattered from the circumferential edge portion of the substrate W toward the side of the substrate W.

When a predetermined period has elapsed since the start of the discharge of the rinse liquid from the nozzle 4, the control device 7 opens the leak valve 32 to remove the compressed air from the interior of the extension and contraction portion 28 of the air cylinder 26. In this way, the extension and contraction portion 28 is contracted and is returned to the most contracted state. Thus, the downward load provided to the nozzle 4 from the air cylinder 26 is cancelled. The nozzle 4 receives the upward force provided from the coil spring 27 so as to be lifted to the lower position (step S9). By the function of the coil spring 27, without provision of another lifting/lowering unit, the nozzle 4 can be satisfactorily lifted. By the lifting of the nozzle 4, the annular lower discharge port 49 formed between the circumferential edge portion 39 of the trumpet-shaped portion 38 and the upper surface of the substrate W disappears.

Then, the control device 7 closes the first rinse liquid valve 56 and the second rinse liquid valve 61. In this way, the discharge of the rinse liquid from the lower discharge port 49 and the upper discharge port 48 is stopped (step S10).

Then, the control device 7 controls the arm lifting/lowering unit 20 to lift the nozzle arm 17 (step S11). By the lifting of the nozzle arm 17, the nozzle 4 is significantly lifted upward from the upper surface of the substrate W.

The control device swings the nozzle arm 17 to return the nozzle 4 to the retraction position on the side of the spin chuck 3 (step S12).

The control device 7 controls the spin motor 12 to rotate the substrate W at a high rotation speed (for example, 1000 rpm or more). In this way, the rinse liquid adhered to the upper surface of the substrate W is spun off to the surrounding area of the substrate W. In this way, the liquid is removed from the substrate W, and the upper surface of the substrate W is dried (S13: spin dry). When the spin dry processing is performed for a predetermined period, the control device 7 controls the spin motor 12 to stop the rotation (rotation of the substrate W) of the spin chuck 3 (step S14). In this way, the cleaning processing on one substrate W is completed, and the processed substrate W is transported out of the chamber 2 by the transfer robot (step S15).

As described above, in the first preferred embodiment, the processing liquid is discharged radially in the horizontal direction from the annular lower discharge port 49 formed between the upper surface of the substrate W and the lower end edge of the nozzle 4. In a state where the downward force produced by the own weight of the nozzle 4 and the downward force produced by the air cylinder 26 are applied to the nozzle 4, the nozzle 4 is held in such a position that the downward forces described above are in balance with the upward force produced by the pulling of the coil spring 27 and the upward force produced by the discharge of the processing liquid from the lower discharge port 49.

The flow rate of the processing liquid discharged from the lower discharge port 49 and the flow rate of the compressed air toward the air cylinder 26 are set such that the space between the lower end edge of the nozzle 4 and the upper surface of the substrate W is extremely small. Hence, the opening width W3 of the annular lower discharge port 49 is set extremely small. Thus, it is possible to increase the flow speed of the processing liquid discharged from the lower discharge port 49. In this way, it is possible to increase the flow speed in the supply position of the processing liquid from the lower discharge port 49 on the upper surface of the substrate W, with the result that it is possible to satisfactorily remove foreign substances such as particles adhered to the upper surface of the substrate W.

Since the lower end portion 37 of the inner cylinder 35 includes the enlarged diameter inner wall whose diameter is enlarged so as to separate from the vertical axis A3 as the lower end portion 37 is extended downward, in the process in which the processing liquid flows from first flow path 42 toward the lower discharge port 49, a lateral flow is formed. Moreover, since the enlarged diameter inner wall includes the convex curved wall 41 which is extended in a trumpet shape, a turbulent flow is prevented from being generated in the flow of the processing liquid from the first flow path 42 to the lower discharge port 49, and thus the processing liquid can be smoothly guided toward the lower discharge port 49. Furthermore, since the flat plate-shaped portion 40 provided in the circumferential edge portion 39 of the trumpet-shaped portion 38 guides, in the horizontal direction, the processing liquid discharged from the lower discharge port 49, it is possible to further increase the flow speed of the processing liquid discharged from the lower discharge port 49 in the horizontal direction. In this way, the flow speed of the SC1 discharged from the annular lower discharge port 49 of the nozzle 4 in the horizontal direction is extremely high. Hence, it is possible to more satisfactorily remove foreign substances such as particles adhered to the upper surface of the substrate W.

The processing liquid is also discharged radially from the annular upper discharge port 48 arranged adjacent to above the lower discharge port 49. The processing liquid discharged from the upper discharge port 48 covers, from the upper side, the processing liquid discharged from the lower discharge port 49. Hence, since on the upper side of the processing liquid discharged from the lower discharge port 49, a flow of the processing liquid discharged from the upper discharge port 48 is formed, the processing liquid discharged from the lower discharge port 49 is prevented from flowing upward. In this way, the processing liquid discharged from the lower discharge port 49 can be passed in the horizontal direction.

When the opening width W3 of the lower discharge port 49 is set extremely small, the processing liquid discharged from the lower discharge port 49 is jetted at a high discharge pressure, and is scattered to the surrounding area, with the result that this may cause particle generation. However, since the processing liquid discharged from the lower discharge port 49 is covered by the processing liquid discharged from the upper discharge port 48, the scattering of the processing liquid discharged from the lower discharge port 49 can be prevented.

In the first preferred embodiment, the example where the nozzle 4 is formed with the inner cylinder 35 having the trumpet-shaped portion 38 and the outer cylinder 36 is described. As the form of the inner cylinder 35, various variations can be adopted.

Figure 9:
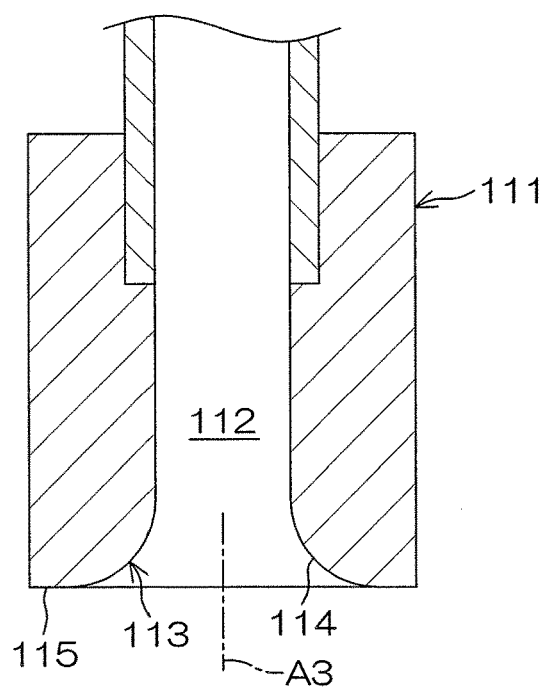
FIG. 9 is a cross-sectional view showing a first variation of the first cylindrical member.

An inner cylinder (first cylindrical member) 111 according to a first variation shown in FIG. 9 has an outer cylindrical shape. The inner cylinder 111 is arranged on the vertical axis A3. The internal space of the inner cylinder 111 serves as a straight first flow path 112 along which the processing liquid from the first processing liquid pipe 52 (see FIG. 1) is passed. In a lower end portion 113 of the inner wall of the inner cylinder 111, a convex curved wall (enlarged diameter inner wall) 114 that is extended downward in a trumpet shape is formed. The inner cylinder 111 includes a lower surface (flat surface portion) 115 formed with a horizontal flat surface. The convex curved wall 114 includes the lower surface 115. When the inner cylinder 111 is brought close to the substrate W (see FIG. 2) held by the spin chuck 3 (see FIG. 1), between the outer circumferential edge of the lower surface 115 and the upper surface of the substrate W, a lateral annular lower discharge port (which corresponds to the lower discharge port 49 of FIG. 4) is formed.

Since the lower end portion 113 of the inner cylinder 111 includes the convex curved wall 114, in the process in which the processing liquid flows from the first flow path 112 toward the lower discharge port, a lateral flow is formed. Moreover, since the convex curved wall 114 is extended in a trumpet shape, a turbulent flow is prevented from being generated in the flow of the processing liquid from the first flow path 112 to the lower discharge port, and thus the processing liquid can be smoothly guided toward the lower discharge port.

Figure 10:
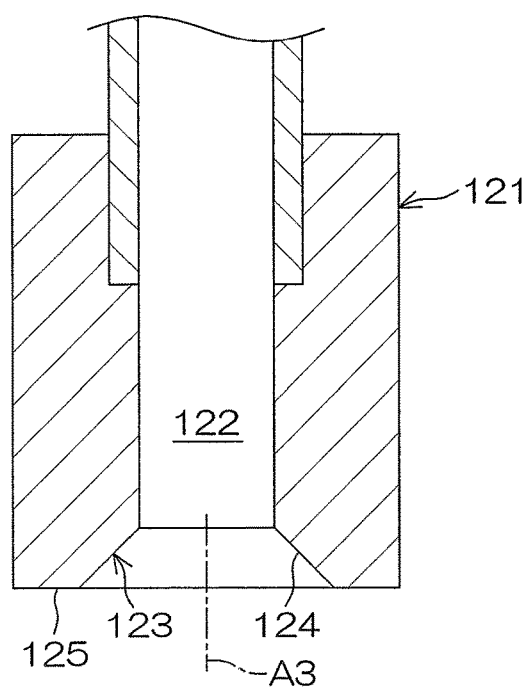
FIG. 10 is a cross-sectional view showing a second variation of the first cylindrical member.

An inner cylinder (first cylindrical member) 121 according to a second variation shown in FIG. 10 has an outer cylindrical shape. The inner cylinder 121 is arranged on the vertical axis A3. The internal space of the inner cylinder 121 serves as a straight first flow path 122 along which the processing liquid from the first processing liquid pipe 52 (see FIG. 1) is passed. In a lower end portion 123 of the inner wall of the inner cylinder 121, a taper wall 124 that is extended downward is formed. The inner cylinder 121 includes a lower surface 125 formed with a horizontal flat surface. The taper wall 124 includes the lower surface 125. When the inner cylinder 121 is brought close to the substrate W (see FIG. 2) held by the spin chuck 3 (see FIG. 1), between the outer circumferential edge of the lower surface 125 and the upper surface of the substrate W, a lateral annular lower discharge port (which corresponds to the lower discharge port 49 of FIG. 4) is formed.

Since the lower end portion 123 of the inner cylinder 121 includes the taper wall 124, in the process in which the processing liquid flows from the first flow path 122 toward the lower discharge port, a lateral flow is formed. Moreover, since the taper wall 124 is extended in a tapered shape, a turbulent flow is prevented from being generated in the flow of the processing liquid from the first flow path 122 to the lower discharge port, and thus the processing liquid can be smoothly guided toward the lower discharge port.

Figure 11:
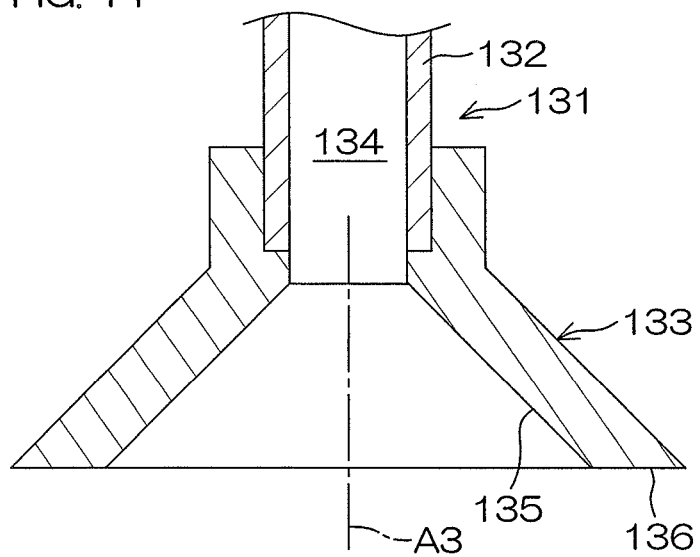
FIG. 11 is a cross-sectional view showing a third variation of the first cylindrical member.

An inner cylinder (first cylindrical member) 131 according to a third variation shown in FIG. 11 includes a cylinder 132 and a substantially cylindrical (substantially tapered) taper portion 133 attached to a lower end of the cylinder 132. The cylinder 132 is arranged on the vertical axis A3. The internal space of the cylinder 132 serves as a straight first flow path 134 along which the processing liquid from the first processing liquid pipe 52 (see FIG. 1) is passed. The taper portion 133 is attached to the cylinder 132 in such a vertical position that as it is extended downward, the diameter is enlarged. In the inner circumference of the taper portion 133, a taper wall 135 that is extended downward is formed. In a lower end portion of the outer circumference of the taper portion 133, a lower end surface 136 formed with a horizontal flat surface is formed. When the inner cylinder 131 is brought close to the substrate W (see FIG. 2) held by the spin chuck 3 (see FIG. 2), between the lower end surface 136 of the taper portion 133 and the upper surface of the substrate W, a lateral annular lower discharge port (which corresponds to the lower discharge port 49 of FIG. 4) is formed.

In the process in which the processing liquid flows within the taper portion 133 toward the lower discharge port, a lateral flow is formed. Moreover, since the taper wall 135 is extended in a tapered shape, the processing liquid can be relatively smoothly guided toward the lower discharge port.

Figure 12:
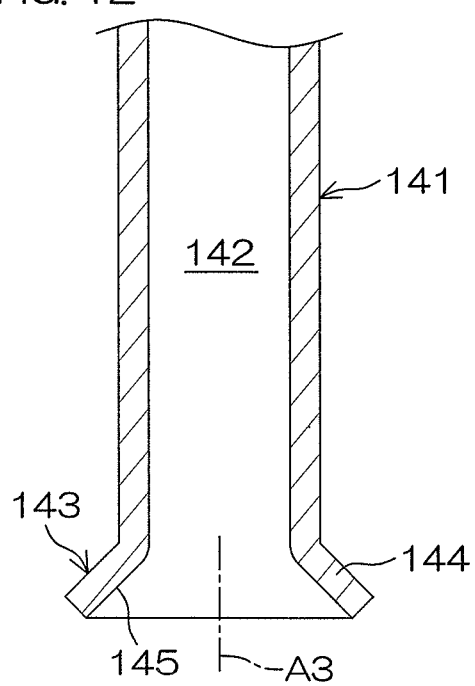
FIG. 12 is a cross-sectional view showing a fourth variation of the first cylindrical member.

In an inner cylinder (first cylindrical member) 141 according to a fourth variation shown in FIG. 12, its lower end portion is formed in a flared shape. In other words, the inner cylinder 141 is cylindrical except the lower end portion. The inner cylinder 141 is arranged on the vertical axis A3. The internal space of the inner cylinder 141 serves as a straight first flow path 142 along which the processing liquid from the first processing liquid pipe 52 (see FIG. 1) is passed. In a lower end portion 143 of the inner cylinder 141, a truncated cone-shaped (tapered) taper portion 144 that is extended downward is formed. In the inner circumference of the taper portion 144, a taper wall 145 that is extended downward is formed. When the inner cylinder 141 is brought close to the substrate W (see FIG. 2) held by the spin chuck 3 (see FIG. 2), between the outer circumferential edge (lower end edge) of the taper portion 144 and the upper surface of the substrate W, a lateral annular lower discharge port (which corresponds to the lower discharge port 49 of FIG. 4) is formed.

In the process in which the processing liquid flows within the taper portion 144 toward the lower discharge port, a lateral flow is formed. Moreover, since the taper wall 145 is extended in a tapered shape, the processing liquid can be relatively smoothly guided toward the lower discharge port.

Although it is described that the inner cylinders 35, 111, 121, 131 and 141 shown in FIGS. 3 and 9 to 12 are substantially cylindrical, they may be formed substantially in the shape of a rectangular cylinder having a longitudinal portion in the horizontal direction.

Figure 13:
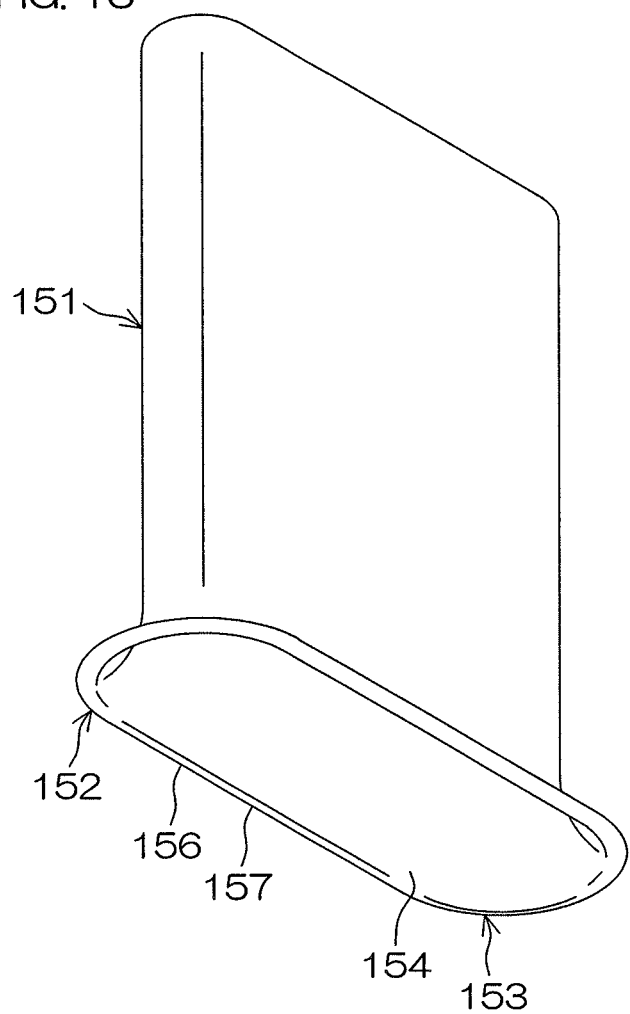
FIG. 13 is a cross-sectional view showing a fifth variation of the first cylindrical member.

For example, an inner cylinder (first cylindrical member) 151 according to a fifth variation shown in FIG. 13 is formed substantially in the shape of a rectangular cylinder having a longitudinal portion in the horizontal direction. A cross-sectional shape of the inner cylinder 151 along the horizontal direction is a rounded rectangle. The inner cylinder 151 is arranged on the vertical axis A3 (see FIG. 1 and the like).

The inner cylinder 151 is formed in the shape of a rectangular cylinder except a lower end portion (tip end portion) 152. The lower end portion 152 of the inner cylinder 151 includes a convex curved portion 153 that is extended cross-sectional shape along the vertical direction is formed in the shape of a trumpet, that is extended downward. The inner wall of the convex curved portion 153 includes a convex curved wall 154 that is extended downward in a trumpet shape. The internal space of the inner cylinder 151 serves as a straight first flow path 155 along which the processing liquid from the first processing liquid pipe 52 to be described later is passed. The circumferential edge portion (tip end edge) 156 of the convex curved portion 153 includes a flat plate-shaped portion (flat surface portion) 157 that is extended along the horizontal direction. When the inner cylinder 151 is brought close to the substrate W (see FIG. 2) held by the spin chuck 3 (see FIG. 2), between the flat plate-shaped portion 157 and the upper surface of the substrate W, a lateral annular lower discharge port (which corresponds to the lower discharge port 49 of FIG. 4) is formed.

Although in the first preferred embodiment, the description is given using the example where the SC1 is adopted as the chemical liquid (cleaning chemical liquid), SC2 (hydrochloric acid/hydrogen peroxide mixture: hydrochloric acid hydrogen peroxide), SPM (sulfuric acid/hydrogen peroxide mixture: sulfuric acid hydrogen peroxide), a mixture liquid of $O_3$ and $NH_4OH$ and the like can be illustrated.

Figure 14:
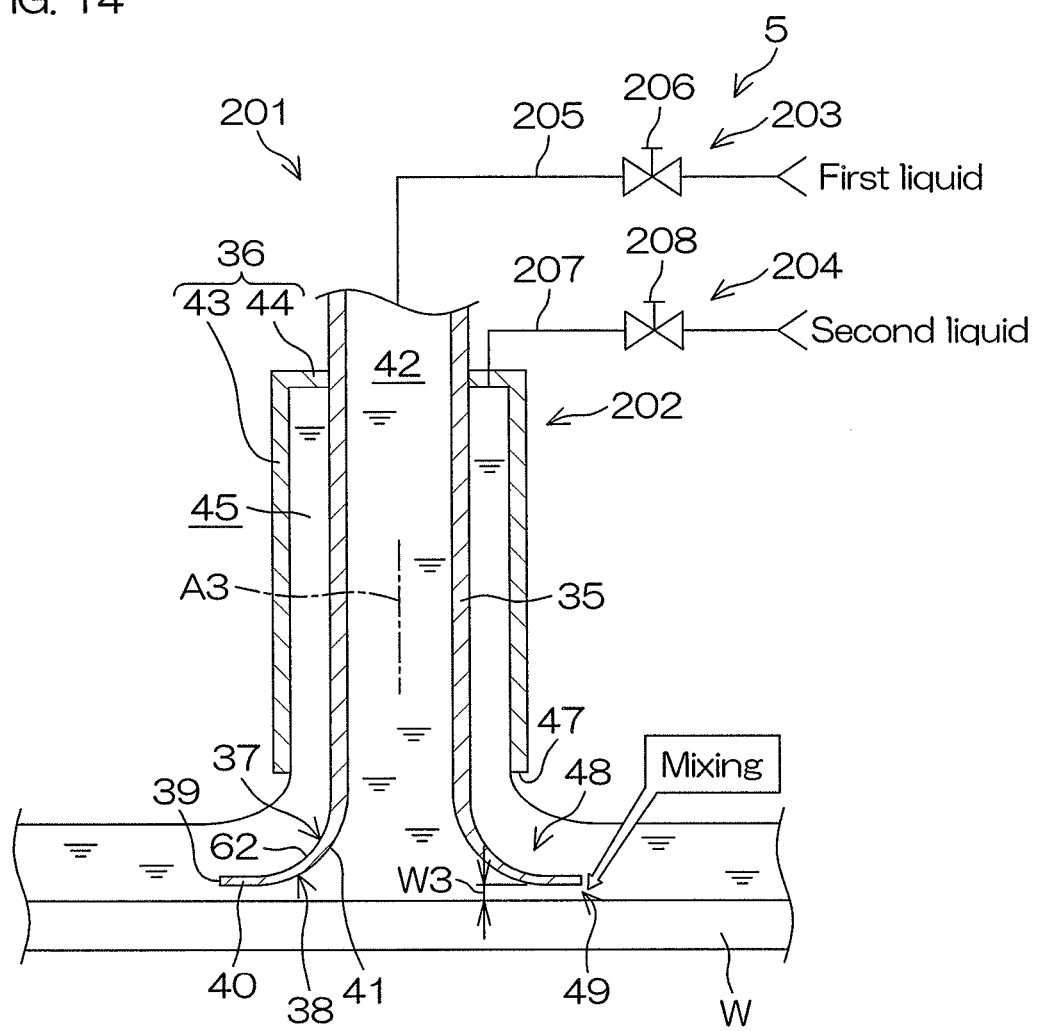
FIG. 14 is an enlarged cross-sectional view showing a nozzle included in a substrate processing apparatus according to a second preferred embodiment of the present invention.

FIG. 14 is an enlarged cross-sectional view showing a nozzle 202 included in a substrate processing apparatus 201 according to a second preferred embodiment of the present invention.

In the second preferred embodiment, portions corresponding to the portions shown in the first preferred embodiment are identified with the same reference symbols as in FIGS. 1 to 13, and the description thereof will be omitted.

The nozzle 202 included in the substrate processing apparatus 201 according to the second preferred embodiment differs from the nozzle 4 included in the substrate processing apparatus 1 according to the first preferred embodiment in that the type of liquid supplied to the first flow path 42 and the type of liquid supplied to the second flow path 45 are made to differ from each other.

As shown in FIG. 1, the processing fluid supply unit 5 includes a first liquid supply unit (first fluid supply unit) 203 for supplying a first liquid to the first flow path 42 of the nozzle 4 and a second liquid supply unit (second fluid supply unit) 204 that supplies a second liquid different from the first liquid to the second flow path 45 of the nozzle 4. The first liquid supply unit 203 includes a first liquid pipe 205 for supplying the first liquid to the first flow path 42 and a first liquid valve 206 that opens and closes the first liquid pipe 205. The second liquid supply unit 204 includes a second liquid pipe 207 that supplies the second liquid to the second flow path 45 and a second liquid valve 208 that opens and closes the second liquid pipe 207. The first liquid valve 206 is opened, and thus the first liquid is supplied to the first flow path 42, and the first liquid passed along the first flow path 42 is discharged from the lower discharge port 49. The second liquid valve 208 is opened, and thus the second liquid is supplied to the second flow path 45, and the second liquid passed along the second flow path 45 is discharged from the upper discharge port 48. In other words, the discharge of the first liquid from the lower discharge port 49 and the discharge of the second liquid from the upper discharge port 48 are performed at the same time. The annular upper discharge port 48 and the annular lower discharge port 49 are adjacent to each other in an up/down direction, and thus the second liquid discharged from the upper discharge port 48 covers, from the upper side, the first liquid discharged from the lower discharge port 49. Hence, the first liquid and the second liquid can be mixed immediately before they reach the upper surface of the substrate W. Since the upper discharge port 48 and the lower discharge port 49 are adjacent to each other in the up/down direction, it is possible to increase the efficiency of contact between the first liquid and the second liquid, and thus it is possible to efficiently mix the first liquid and the second liquid.

As the combination of the first liquid and the second liquid, a combination in which they are mixed with each other to react with each other to generate a mixture liquid can be illustrated. As the combination of the first liquid and the second liquid described above ([first liquid; second liquid]), a combination of [$H_2O_2$; $H_2O_2$], a combination of [HCL; $H_2O_2$], a combination of [$H_2SO_4$; $H_2O_2$] and the like can be illustrated. In this case, the first liquid and the second liquid are mixed immediately before they reach the upper surface of the substrate W, and thus it is possible to supply, to the upper surface of the substrate W, a fresh mixture liquid immediately after being generated.

As the combination of the first liquid and the second liquid, a combination may be adopted in which as the first liquid, the chemical liquid (cleaning chemical liquid) is used and as the second liquid, $H_2O$ (DIW) is used.

In this case, the chemical liquid is discharged from the lower discharge port 49, and $H_2O$ is discharged from the upper discharge port 48. When the opening width W3 of the lower discharge port 49 is set extremely small, the chemical liquid discharged from the lower discharge port 49 is jetted at a high discharge pressure, and is scattered to the surrounding area, with the result that this may cause particle generation. However, since the chemical liquid discharged from the lower discharge port 49 is covered by the chemical liquid discharged from the upper discharge port 48, the scattering of the chemical liquid discharged from the lower discharge port 49 can be prevented.

In the vicinity of the lower discharge port 49 whose flow speed is the fastest, only the chemical liquid is present. Hence, with the chemical liquid, it is possible to satisfactorily perform processing (cleaning) on the upper surface of the substrate W. Thus, it is possible to reduce the amount of chemical liquid used without lowering the efficiency of the processing (cleaning efficiency) of the chemical liquid.

As the combination of the first liquid and the second liquid described above ([first liquid; second liquid]), a combination of [SC1; DIW], a combination of [HOT SCI (SC1 of high temperature (for example, 60 to 80° C.)); HOT DIN (DIW of high temperature (for example, 60 to 80° C.))], a combination of [$H_2O_2$; $NH_4OH+H_2O$], a combination of [SC2; DIW], a combination of [HOT SC2 (SC2 of high temperature (for example, 60 to 80° C.)); HOT DIW (DIN of high temperature (for example, 60 to 80° C.))] and the like can be illustrated.

Figure 15:
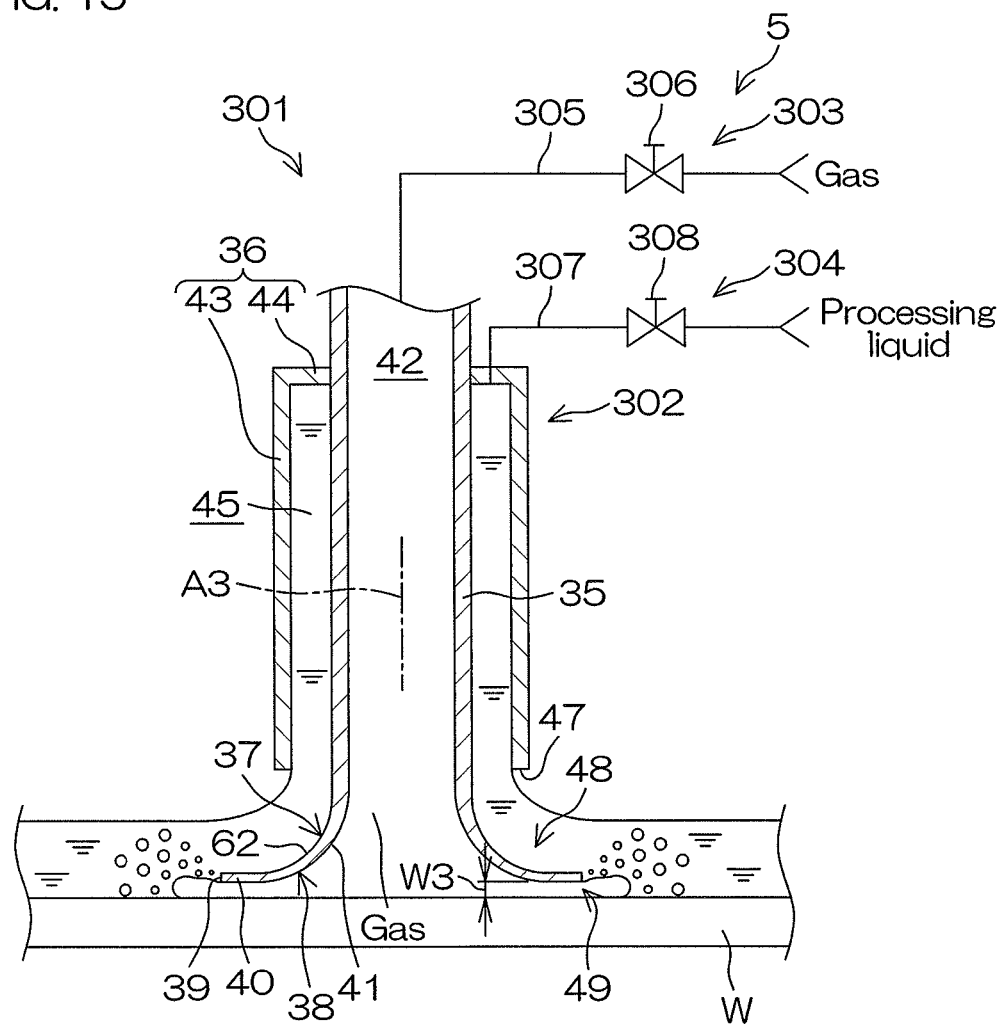
FIG. 15 is an enlarged cross-sectional view showing a nozzle included in a substrate processing apparatus according to a third preferred embodiment of the present invention.

FIG. 15 is an enlarged cross-sectional view showing a nozzle 302 included in a substrate processing apparatus 301 according to a third preferred embodiment of the present invention.

In the third preferred embodiment, portions corresponding to the portions shown in the first preferred embodiment are identified with the same reference symbols as in FIGS. 1 to 13, and the description thereof will be omitted.

The nozzle 302 included in the substrate processing apparatus 301 according to the third preferred embodiment differs from the nozzle 4 included in the substrate processing apparatus 1 according to the first preferred embodiment in that a gas is supplied to the first flow path 42 and the processing liquid (liquid) is supplied to the second flow path 45.

As shown in FIG. 1, the processing fluid supply unit 5 includes a gas supply unit (first fluid supply unit) 303 for supplying the gas to the first flow path 42 of the nozzle 4 and a processing liquid supply unit (second fluid supply unit) 304 for supplying the processing liquid to the second flow path 45 of the nozzle 4. The gas supply unit 303 includes a gas pipe 305 that supplies the gas to the first flow path 42 and a gas valve 306 that opens and closes the gas pipe 305. The processing liquid supply unit 304 includes a processing liquid pipe 307 that supplies the processing liquid to the second flow path 45 and a processing liquid valve 308 that opens and closes the processing liquid pipe 307. The gas valve 306 is opened, and thus the gas is supplied to the first flow path 42, and the gas passed along the first flow path 42 is discharged from the lower discharge port 49. The processing liquid valve 308 is opened, and thus the processing liquid is supplied to the second flow path 45, and the processing liquid passed along the second flow path 45 is discharged from the upper discharge port 48. In other words, the discharge of the gas from the lower discharge port 49 and the discharge of the processing liquid from the upper discharge port 48 are performed at the same time. The annular upper discharge port 48 and the annular lower discharge port 49 are adjacent to each other in the up/down direction, and thus the high-speed gas is blown from the horizontal direction to the processing liquid discharged from the upper discharge port 48. In this way, immediately before the processing liquid reaches the upper surface of the substrate W, the processing liquid and the gas collide with each other to form droplets of the processing liquid. The droplets of the processing liquid formed are supplied to the upper surface of the substrate W. The droplets form a jet, and the jet is supplied to the upper surface of the substrate W. By the kinetic energy of the droplets of the processing liquid, it is possible to physically remove foreign substances such as particles adhered to the upper surface of the substrate W.

As examples of the combination of the gas and the processing liquid ([gas; processing liquid]), a combination of [$N_2$; DIW], a combination of [$N_2$; SC1], a combination of [$N_2$; SC2] and the like can be illustrated.

As another example of the combination of the gas and the processing liquid ([gas; processing liquid]), a combination of [$O_3$; $NH_4OH+H_2O$] can be illustrated. In this case, ($NH_4OH+H_2O$) and high-speed $O_3$ can be mixed immediately before they reach the upper surface of the substrate W, and ($NH_4OH+H_2O$) immediately after being mixed with $O_3$ can be supplied to the upper surface of the substrate W. Although after the mixing of $O_3$ and ($NH_4OH+H_2O$), $O_3$ is decomposed by $NE_4OH$ as time passes, by mixing ($NH_4OH+H_2O$) and $O_3$ immediately before they reach the upper surface of the substrate W, undecomposed and fresh ($NH_4OH+H_2O+O_3$) can be supplied to the upper surface of the substrate W.

Figure 16:
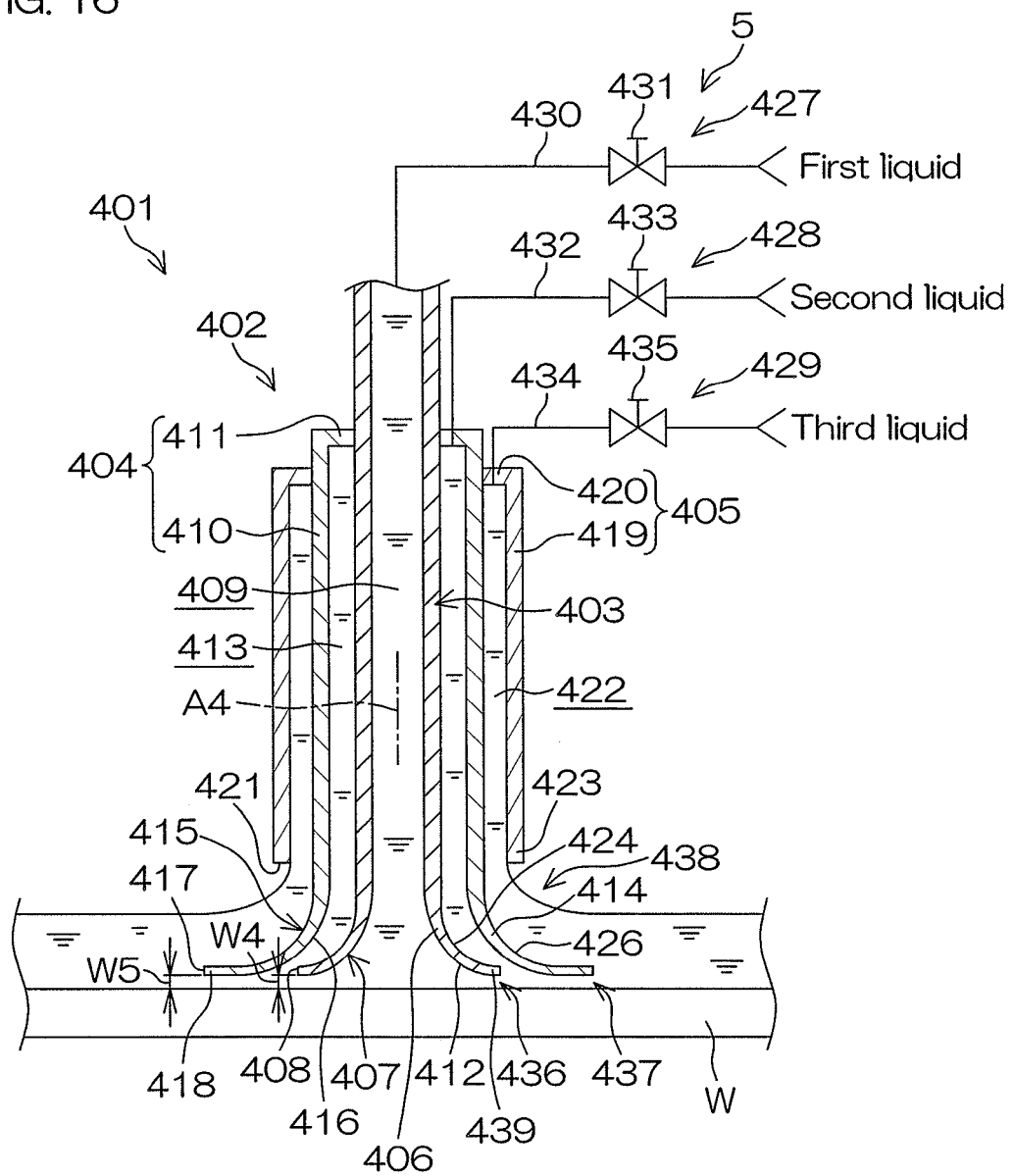
FIG. 16 is an enlarged cross-sectional view showing a nozzle included in a substrate processing apparatus according to a fourth preferred embodiment of the present invention.

FIG. 16 is an enlarged cross-sectional view showing a nozzle 402 included in a substrate processing apparatus 401 according to a fourth preferred embodiment of the present invention.

In the fourth preferred embodiment, portions corresponding to the portions shown in the first preferred embodiment are identified with the same reference symbols as in FIGS. 1 to 13, and the description thereof will be omitted.

The nozzle 402 included in the substrate processing apparatus 401 according to the fourth preferred embodiment differs from the nozzle 4 included in the substrate processing apparatus 1 according to the first preferred embodiment in that not only a first flow path 409 and a second flow path 413 but also a third flow path 422 is provided therewithin.

The nozzle 402 includes an inner cylinder (first cylindrical member) 403, an intermediate cylinder (first cylindrical member) 404 that is externally fitted to the inner cylinder 403 to surround the inner cylinder 403 and an outer cylinder (second cylindrical member) 405 that is externally fitted to the intermediate cylinder 404 to surround the intermediate cylinder 404. The inner cylinder 403, the intermediate cylinder 404 and the outer cylinder 405 are coaxially arranged on a common vertical axis A4.

The inner cylinder 403 is cylindrical except a lower end portion (tip end portion) 406. The lower end portion 406 of the inner cylinder 403 includes a first trumpet-shaped portion 407 that is extended downward. In other words, the lower end portion 406 of the inner cylinder 403 includes a first convex curved wall 412 that is extended downward in the shape of a trumpet. Furthermore, in other words, the lower end portion 406 of the inner cylinder 403 includes an enlarged diameter inner wall whose diameter is enlarged so as to separate from the vertical axis A4 as the lower end portion 406 of the inner cylinder 403 is extended downward. The circumferential edge portion (tip end edge) 408 of the first trumpet-shaped portion 407 includes a flat plate-shaped portion (flat surface portion) 439 that is extended along the horizontal direction. The circumferential edge portion 408 of the first trumpet-shaped portion 407 is extended, in a plan view, outward of the cylindrical portion 410 of the intermediate cylinder 404 in a radial direction. The internal space of the inner cylinder 403 serves as a straight first flow path 409 along which the first liquid from a third liquid pipe 430, which will be described later, is passed.

The intermediate cylinder 404 includes a cylindrical portion 410 and a first closing portion 411 that closes an upper end portion of the cylindrical portion 410. An area between the outer circumference of the cylindrical portion 410 and the inner circumference of the first closing portion 411 is sealed with a seal member (not shown) in a liquid-tight manner. Between the inner cylinder 403 and the cylindrical portion 410 of the intermediate cylinder 404, a cylindrical second flow path 413 is formed along which the second liquid from a fourth liquid pipe 432, which will be described later, is passed.

The cylindrical portion 410 of the inner cylinder 404 is cylindrical except a lower end portion (tip end portion) 414. The lower end portion 414 of the cylindrical portion 410 includes a second trumpet-shaped portion 415 that is extended downward. In other words, the lower end portion 414 of the cylindrical portion 410 includes a second convex curved wall 416 that is extended downward in the shape of a trumpet. Furthermore, in other words, the lower end portion 414 of the cylindrical portion 410 includes an enlarged diameter inner wall whose diameter is enlarged so as to separate from the vertical axis A4 as the lower end portion 414 is extended downward. The circumferential edge portion (tip end edge) 417 of the second trumpet-shaped portion 415 includes a flat plate-shaped portion (flat surface portion) 418 that is extended along the horizontal direction. The circumferential edge portion 417 of the second trumpet-shaped portion 415 is extended, in a plan view, outward of the outer cylinder 405 in a radial direction.

The outer cylinder 405 includes a cylindrical portion 419 and a second closing portion 420 that closes an upper end portion of the cylindrical portion 419. An area between the outer circumference of the cylindrical portion 410 of the intermediate cylinder 404 and the inner circumference of the first closing portion 411 is sealed with a seal member (not shown) in a liquid-tight manner. Between the cylindrical portion 410 of the intermediate cylinder 404 and the cylindrical portion 419 of the outer cylinder 405, a cylindrical third flow path 422 is formed along which the third liquid from a fifth liquid pipe 434, which will be described later, is passed.

The inner cylinder 403, the intermediate cylinder 404 and the outer cylinder 405 are individually formed of a resin material such as polyvinyl chloride, PCTFE (polychlorotrifluoroethylene), PVDF (polyvinylidene fluoride), PTFE (polytetrafluoroethylene) or PFA (perfluoro-alkylvinyl-ether-tetrafluoro-ethlene-copolymer)

Since the lower end portion 406 of the inner cylinder 403 includes the first trumpet-shaped portion 407 that is extended downward, the downstream end portion of the second flow path 413 is defined with a trumpet-shaped first concave curved wall 424 and a trumpet-shaped second convex curved wall 416. Hence, in the process in which the second liquid flows along the second flow path 413 toward the lower discharge port 437 which will be described later, a flow in the horizontal direction is formed. Moreover, since the first concave curved wall 424 and the second convex curved wall 416 are trumpet-shaped, a turbulent flow is prevented from being generated in the flow of the second liquid from the second flow path 413 to the second lower discharge port 437, and thus the second liquid can be smoothly guided toward the second lower discharge port 437.

In the lower end portion of the outer cylinder 405, an annular upper discharge port (second discharge port) 424 is defined by a lower end edge 421 (tip end edge) of the outer cylinder 405 and the lower end portion 423 of the cylindrical portion 410 of the intermediate cylinder 404. The upper discharge port 438 is a lateral discharge port, and discharges the third liquid passed along the third flow path 422 radially in the horizontal direction.

Since the lower end portion 423 of the cylindrical portion 410 of the intermediate cylinder 404 includes the second trumpet-shaped portion 415 that is extended toward the upper surface of the substrate W, the downstream end portion of the third flow path 422 is formed with the trumpet-shaped second convex curved wall 426. Hence, in the process in which the third liquid flows along the third flow path 422 toward the upper discharge port 438, a flow in the horizontal direction is formed. Moreover, since the second concave curved wall 426 is trumpet-shaped, a turbulent flow is prevented from being generated in the flow of the third liquid from the third flow path 422 to the upper discharge port 438, and thus the third liquid can be smoothly guided toward the upper discharge port 438.

The processing fluid supply unit 5 includes a third liquid supply unit (first fluid supply unit) 427 for supplying the first liquid to the first flow path 409 of the nozzle 402, a fourth liquid supply unit (first fluid supply unit) 428 for supplying the second liquid different from the first liquid to the second flow path 413 of the nozzle 402 and a fifth liquid supply unit (second fluid supply unit) 429 for supplying the third liquid different from the first liquid and the second liquid to the third flow path 422 of the nozzle 402. The third liquid supply unit 427 includes a third liquid pipe 430 that supplies the first liquid to the first flow path 409 and a third liquid valve 431 that opens and closes the third liquid pipe 430. The fourth liquid supply unit 428 includes a fourth liquid pipe 432 that supplies the second liquid to the second flow path 413 and a fourth liquid valve 433 that opens and closes the fourth liquid pipe 432. The fifth liquid supply unit 429 includes a fifth liquid pipe 434 that supplies the third liquid to the third flow path 422 and a fifth liquid valve 435 that opens and closes the fifth liquid pipe 434.

The third liquid valve 431 is opened, and thus the first liquid is supplied to the first flow path 409. The fourth liquid valve 433 is opened, and thus the second liquid is supplied to the second flow path 413. The fifth liquid valve 435 is opened, and thus the third liquid is supplied to the third flow path 422.

When the substrate processing apparatus 401 performs the processing on the substrate W, the nozzle 402 is arranged, by the swinging and the lifting and lowering of the nozzle arm 17, in the lower position in which the lower end edge of the nozzle 402 is opposite to the upper surface of the substrate W with a space (space substantially equal to the space W2 of FIG. 2) apart from the upper surface of the substrate W. Here, the heights of the lower end edge (the circumferential edge portion 408 of the first trumpet-shaped portion 407) of the inner cylinder 403 and the lower end edge (the circumferential edge portion 417 of the second trumpet-shaped portion 415) of the intermediate cylinder 404 in the vertical direction are flush with each other. In this state, the third liquid valve 431, the fourth liquid valve 433 and the fifth liquid valve 435 are opened. In this way, the first liquid is supplied to the first flow path 409, the second liquid is supplied to the second flow path 413 and the third liquid is supplied to the third flow path 422. When in this state, the nozzle 402 is further lowered to a close position which is much lower than the lower position, between the circumferential edge portion 408 of the first trumpet-shaped portion 407 and the upper surface of the substrate W, an annular first lower discharge port (first discharge port) 436 is defined, between the circumferential edge portion 417 of the second trumpet-shaped portion 415 and the upper surface of the substrate W, an annular second lower discharge port (first discharge port) 437 is defined.

The first lower discharge port 436 discharges the first liquid flowing through the first flow path 409 radially in the horizontal direction. The second lower discharge port 437 discharges, in a position apart from the vertical axis A4 as compared with the first lower discharge port 436, the first liquid flowing through the second flow path 413 radially in the horizontal direction.

The second liquid is passed along the second flow path 413 toward the second lower discharge port 437, and thus the second liquid presses the first trumpet-shaped portion 407 downward. The third liquid is passed along the third flow path 422 toward the upper discharge port 438, and thus the third liquid presses the second trumpet-shaped portion 415 downward. In other words, a downward force is applied to the nozzle 402 by the second liquid passed along the second flow path 413 and the third liquid passed along the third flow path 422.

Then, the height position of the nozzle 402 in the vertical direction is held in such a position that a downward force (the resultant force of a downward force produced by the own weight of the nozzle 402, the holder 24 and the like, a downward force produced by the air cylinder 26 and a pressing force produced by the second liquid passed along the second flow path 413 and the third liquid passed along the third flow path 422) is in balance with an upward force (the resultant force of an upward force produced by the pulling of the coil spring 27, an upward force produced by the discharge of the first fluid from the first lower discharge port 436 and an upward force produced by the discharge of the second fluid from the second lower discharge port 437). In this case, the flow rate of the first liquid discharged from the first lower discharge port 436, the flow rate of the second liquid discharged from the second lower discharge port 437 and the flow rate of the compressed air toward the air cylinder 26 are set such that the space between the lower end edge of the nozzle 4 and the upper surface of the substrate W is extremely small. Hence, an opening width W4 in the first lower discharge port 436 and an opening width W5 in the second lower discharge port 437 are set extremely small.

The opening width W4 in the first lower discharge port 436 is set extremely small. Since the lower end portion 406 of the inner cylinder 403 includes an enlarged diameter inner wall whose diameter is enlarged so as to separate from the vertical axis A4 as the lower end portion 406 is extended downward, in the process in which the first liquid flows from the first flow path 409 toward the first lower discharge port 436, a lateral flow is formed. Moreover, since the enlarged diameter inner wall includes the first convex curved wall 412 in which the enlarged diameter inner wall is extended in a trumpet shape, a turbulent flow is prevented from being generated in the flow of the first liquid from the first flow path 409 to the first lower discharge port 436, and thus the first liquid can be smoothly guided toward the first lower discharge port 436. In this way, the flow speed of the first liquid discharged from the annular first lower discharge port 436 in the horizontal direction is extremely high.

The first liquid discharged from the first lower discharge port 436 is covered from the upper side by the second liquid passed along the second flow path 413. Hence, the first liquid and the second liquid can be mixed immediately before they reach the upper surface of the substrate W. The mixture liquid of the first liquid and the second liquid flows at high speed in the horizontal direction toward the second lower discharge port 437. The mixture liquid of the first liquid and the second liquid is discharged from the second lower discharge port 437. In the process in which the mixture liquid of the first liquid and the second liquid passes the second lower discharge port 437, which is a narrow space, the first liquid and the second liquid are mixed. In this way, it is possible to uniformly mix the first liquid and the second liquid.

The opening width W5 in the second lower discharge port 437 is set extremely small. Since the lower end portion of the second flow path 413 is defined by the trumpet-shaped first concave curved wall 424 and the trumpet-shaped second convex curved wall 416, in the process in which the second liquid flows along the second flow path 413 toward the second lower discharge port 437, which will be described later, a flow in the horizontal direction is formed. Moreover, since the first concave curved wall 424 and the second convex curved wall 416 are trumpet-shaped, a turbulent flow is prevented from being generated in the flow of the second liquid from the second flow path 413 to the second lower discharge port 437, and thus the second liquid can be smoothly guided toward the second lower discharge port 437. In this way, the flow speed of the mixture liquid of the first liquid and the second liquid discharged from the annular second lower discharge port 437 in the horizontal direction is extremely high. Hence, it is possible to more satisfactorily remove foreign substances such as particles adhered to the upper surface of the substrate W.

The third liquid is also discharged radially from the annular upper discharge port 438 arranged adjacent to above the second lower discharge port 437. The first liquid discharged from the upper discharge port 438 covers, from the upper side, the mixture liquid of the first liquid and the second liquid discharged from the second lower discharge port 437. Hence, since on the upper side of the mixture liquid of the first liquid and the second liquid discharged from the second lower discharge port 437, a flow of the third liquid discharged from the upper discharge port 438 is formed, the mixture liquid of the first liquid and the second liquid discharged from the second lower discharge port 437 is prevented from flowing upward. In this way, the mixture liquid of the first liquid and the second liquid discharged from the second lower discharge port 437 can be passed in the horizontal direction.

When the opening width W5 of the second lower discharge port 437 is set extremely small, the mixture liquid of the first liquid and the second liquid discharged from the second lower discharge port 437 is jetted at a high discharge pressure, and is scattered to the surrounding area, with the result that this may cause particle generation. However, since the mixture liquid of the first liquid and the second liquid discharged from the second lower discharge port 437 is covered by the third liquid discharged from the upper discharge port 438, the scattering of the mixture liquid of the first liquid and the second liquid discharged from the second lower discharge port 437 can be prevented.

As the combination of the first liquid, the second liquid and the third liquid described above ([first liquid; second liquid; third liquid]), a combination of [$H_2O_2$; $NH_4OH+H_2O$; SC1], a combination of [$H_2O_2$; $HCL+H_2O$; SC2] and the like can be illustrated. In this case, the first liquid and the second liquid are mixed immediately before they reach the upper surface of the substrate W, and thus it is possible to supply, to the upper surface of the substrate W, a fresh mixture liquid immediately after being generated. As the third liquid, the processing liquid (such as the SC1 or the SC2) that has already been mixed can be used. In this case, the third liquid has the effect of preventing the liquid from being scattered and the effect of retaining heat.

Although the five preferred embodiments of this invention are described above, this invention can be practiced in other preferred embodiments.

For example, although in the description of the preferred embodiments described above, as the load application units, the air cylinder (first load application unit) 26 which applies a downward load and the coil spring (second load application unit) 27 which holds an upward load are provided, the coil spring (second load application unit) may be omitted.

Although in the description, the example where the air cylinder (first load application unit) 26 is provided and a downward load is adjusted by the valves 31 and 32 is used, as the first load application unit, a configuration in which it is impossible to adjust the load may be adopted. In this case, the height position of the nozzle 4 may be adjusted by the lifting and lowering of the nozzle arm 17.

As the inner cylinders of the second to fourth preferred embodiments, the inner cylinders 111, 121, 131, 141 and 151 according to the first to fifth variations of the first preferred embodiment may be adopted.

Although in the description of the first to fourth preferred embodiments, the nozzles 4, 202, 302 and 402 are scan nozzles, a fixed nozzle in which the discharge position is fixed may be adopted.

Although in the description, the nozzles 4, 202, 302 and 402 are formed with the inner cylinders 35, 111, 121, 131, 141, 151 and 403 and the outer cylinders 36 and 405 (and the intermediate cylinder 404), the outer cylinders 36 and 405 and the intermediate cylinder 404 may be omitted. In other words, the nozzles 4, 202, 302 and 402 may include only the inner cylinders 35, 111, 121, 131, 141, 151 and 403.

Although in the description of the first to fourth preferred embodiments, the example is used where the nozzles 4, 202, 302 and 402 are held by the nozzle arm 17 in a state where they can be relatively displaced in the up/down direction, the nozzles 4, 202, 302 and 402 may be held by the nozzle arm 17 in a state where the nozzle holding unit 16 is not interposed, that is, in a state where they are not allowed to be displaced in the up/down direction. In this case, by the lifting and lowering of the nozzle arm 17 with the arm lifting/lowering unit 20 or by the drive of the nozzle lifting/lowering unit for lifting and lowering the nozzles 4, 202, 302 and 402 with respect to the nozzle arm 17, the space between the lower end edge of the nozzles 4, 202, 302 and 402 and the upper surface of the substrate W held by the spin chuck 3 is set small.

Although in the description of the first to fourth preferred embodiments, the substrate processing apparatuses 1, 201, 301 and 401 are a device that processes the disk-shaped substrate W, the substrate processing apparatuses 1, 201, 301 and 401 may be an apparatus that processes a polygonal substrate such as a liquid crystal display device glass substrate.

Although the preferred embodiments of the present invention are described in detail above, they are simply specific examples that are used so as to clarify the technical details of the present invention, the present invention should not be interpreted by being limited to these specific examples and the scope of the present invention is limited only by the scope of claims attached.

This application corresponds to Japanese Patent Application No. 2015-27959 and Japanese Patent Application No. 2015-27960 filed with Japan Patent Office on Feb. 16, 2015, and the entire disclosure of these applications is incorporated herein by reference.

What is claimed is:

1. A substrate processing apparatus that performs, on a substrate having a main surface, processing using a processing fluid containing a first fluid, the substrate processing apparatus comprising:
    a substrate holding unit which holds the substrate in a horizontal posture with the main surface directed upward;
    a nozzle which includes a first cylindrical member within which a first flow path through which the first fluid is passed is formed, the first cylindrical member having a tip end edge that opposes to the main surface of the substrate held by the substrate holding unit, the tip end edge of the first cylindrical member and the main surface of the substrate held by the substrate holding unit defining, between the tip end edge and the main surface of the substrate, an annular first discharge port that discharges the first fluid having passed through the first flow path along the main surface of the substrate held by the substrate holding unit radially around the first cylindrical member;
    a support member;
    a nozzle holding unit that couples the nozzle to the support member such that the nozzle is relatively displaceable along a normal to the main surface of the substrate held by the substrate holding unit; and
    a first fluid supply unit that supplies the first fluid to the first flow path of the nozzle, whereby a force is applied to the nozzle in an upward direction apart from the main surface of the substrate by the discharge of the first fluid from the annular first discharge port.

2. The substrate processing apparatus according to claim 1,
    wherein the nozzle holding unit includes:
    a load application unit that applies, to the nozzle, a load in a direction along the normal; and
    a load adjustment unit that adjusts a magnitude of the load applied from the load application unit to the nozzle.

3. The substrate processing apparatus according to claim 2,
    wherein the load application unit includes:
    a first load application unit that applies, to the nozzle, a load in a downward direction approaching toward the main surface of the substrate held by the substrate holding unit; and
    a second load application unit that applies, to the nozzle, a load in the upward direction apart from the main surface of the substrate held by the substrate holding unit, and
    the load adjustment unit adjusts the load applied by the first load application unit to the nozzle.

4. The substrate processing apparatus according to claim 1,
    wherein a tip end portion of the first cylindrical member includes an enlarged diameter inner wall whose diameter is enlarged so as to separate from the normal as the tip end portion approaches downward toward the main surface of the substrate.

5. The substrate processing apparatus according to claim 1,
    wherein the tip end edge of the first cylindrical member includes a flat surface portion that is extended along the main surface of the substrate.

6. The substrate processing apparatus according to claim 1,
    wherein the first fluid is a liquid.

7. The substrate processing apparatus according to claim 1, wherein
    the substrate processing apparatus performs, on the substrate held by the substrate holding unit, processing using a processing fluid containing the first fluid and a second fluid,
    the nozzle further includes a second cylindrical member that surrounds the first cylindrical member, the second cylindrical member and the first cylindrical member defining, between the second cylindrical member and the first cylindrical member, a second flow path through which the second fluid is passed,
    the second cylindrical member discharges the second fluid having passed through the second flow path along the main surface of the substrate held by the substrate holding unit radially around the cylindrical member, and
    the substrate processing apparatus further includes a second fluid supply unit that supplies the second fluid to the second flow path of the nozzle.

8. The substrate processing apparatus according to claim 7,
    wherein an annular second discharge port is defined between a tip end edge of the second cylindrical member and a tip end portion of the first cylindrical member.

9. The substrate processing apparatus according to claim 7,
    wherein the first fluid is a liquid, and
    the second fluid is a liquid of the same composition as the first fluid.

10. The substrate processing apparatus according to claim 7,
    wherein the first fluid is a first liquid, and
    the second fluid is a second liquid of a different type from the first fluid.

11. The substrate processing apparatus according to claim 7,
    wherein the first fluid is a gas, and
    the second fluid is a liquid.

12. A substrate processing apparatus that performs, on a substrate having a main surface, processing using a processing fluid containing a first fluid, the substrate processing apparatus comprising:
    a substrate holding unit which holds the substrate in a horizontal posture with the main surface directed upward;
    a nozzle which includes a first cylindrical member within which a first flow path through which the first fluid is passed is formed, the first cylindrical member having a tip end edge that opposes to the main surface of the substrate held by the substrate holding unit, the tip end edge of the first cylindrical member and the main surface of the substrate held by the substrate holding unit defining, between the tip end edge and the main surface of the substrate, an annular first discharge port that discharges the first fluid flowing through the first flow path along the main surface of the substrate held by the substrate holding unit radially around the first cylindrical member;

a nozzle holding unit which holds the nozzle in a state where the tip end edge of the first cylindrical member is opposite to the main surface of the substrate and spaced apart upward therefrom; and a fluid supply unit which supplies the first fluid to the first flow path of the nozzle, wherein a tip end portion of the first cylindrical member includes an enlarged diameter inner wall whose diameter is enlarged so as to separate from a normal to the main surface of the substrate as the tip end portion approaches downward toward the main surface of the substrate.

13. The substrate processing apparatus according to claim 12, wherein the enlarged diameter inner wall includes a convex curved wall that is extended in a trumpet shape toward the main surface of the substrate.

14. The substrate processing apparatus according to claim 13, wherein the tip end portion of the first cylindrical member includes a trumpet-shaped portion that is extended toward the main surface of the substrate.

15. The substrate processing apparatus according to claim 12, wherein the enlarged diameter inner wall includes a taper wall that is extended toward the main surface of the substrate.

16. The substrate processing apparatus according to claim 15, wherein the tip end portion of the first cylindrical member includes a taper portion that is extended toward the main surface of the substrate.

17. The substrate processing apparatus according to claim 12, wherein the tip end edge of the first cylindrical member includes a flat surface portion that is extended along the main surface of the substrate.

18. The substrate processing apparatus according to claim 12, wherein the first fluid is a liquid.

19. The substrate processing apparatus according to claim 12 wherein the substrate processing apparatus performs, on the substrate held by the substrate holding unit, processing using a processing fluid containing the first fluid and a second fluid, the nozzle further includes a second cylindrical member that surrounds the first cylindrical member, the second cylindrical member and the first cylindrical member defining, between the second cylindrical member and the first cylindrical member, a second flow path through which the second fluid is passed, the second cylindrical member discharges the second fluid having passed through the second flow path along the main surface of the substrate held by the substrate holding unit radially around the second cylindrical member, and the substrate processing apparatus further includes a second fluid supply unit that supplies the second fluid to the second flow path of the nozzle.

20. The substrate processing apparatus according to claim 19, wherein an annular second discharge port is defined between a tip end edge of the second cylindrical member and a tip end portion of the first cylindrical member.

21. The substrate processing apparatus according to claim 19, wherein the first fluid is a liquid, and the second fluid is a liquid of the same composition as the first fluid.

22. The substrate processing apparatus according to claim 19, wherein the first fluid is a first liquid, and the second fluid is a second liquid of a different type from the first liquid.

23. The substrate processing apparatus according to claim 19, wherein the first fluid is a gas, and the second fluid is a liquid.

* * * * *